(12) United States Patent
Watanabe et al.

(10) Patent No.: US 8,216,766 B2
(45) Date of Patent: Jul. 10, 2012

(54) POLYMER, POLYMER PREPARATION METHOD, RESIST COMPOSITION AND PATTERNING PROCESS

(75) Inventors: Takeru Watanabe, Joetsu (JP); Takeshi Kinsho, Joetsu (JP); Tomohiro Kobayashi, Joetsu (JP); Tadahiro Sunaga, Sodegaura (JP); Yuichi Okawa, Sodegaura (JP); Hirofumi Io, Sodegaura (JP)

(73) Assignees: Shin-Etsu Chemical Co., Ltd., Tokyo (JP); Mitsui Chemicals, Inc., Tokyo (JP)

( * ) Notice: Subject to any disclaimer, the term of this patent is extended or adjusted under 35 U.S.C. 154(b) by 411 days.

(21) Appl. No.: 12/411,206

(22) Filed: Mar. 25, 2009

(65) Prior Publication Data
US 2009/0246686 A1 Oct. 1, 2009

(30) Foreign Application Priority Data
Mar. 26, 2008 (JP) .................. 2008-080605

(51) Int. Cl.
*G03F 7/039* (2006.01)
*G03F 7/20* (2006.01)
*G03F 7/30* (2006.01)
*G03F 7/38* (2006.01)

(52) U.S. Cl. .............. 430/270.1; 430/326; 430/330; 430/311; 430/905; 430/942; 430/914; 525/327.2; 525/329.5; 525/353; 525/359.2; 525/359.3; 525/359.4; 525/338

(58) Field of Classification Search ............... None
See application file for complete search history.

(56) References Cited

U.S. PATENT DOCUMENTS

| | | | |
|---|---|---|---|
| 6,372,854 B1 | 4/2002 | Sunaga et al. | |
| 6,605,408 B2 | 8/2003 | Nishi et al. | |
| 6,800,720 B2 | 10/2004 | Yamamoto et al. | |
| 7,081,501 B2 | 7/2006 | Okawa et al. | |
| 2008/0085470 A1* | 4/2008 | Sunaga et al. | 430/296 |
| 2009/0186307 A1 | 7/2009 | Kobayashi et al. | |

FOREIGN PATENT DOCUMENTS

| | | |
|---|---|---|
| JP | 4-39665 A | 2/1992 |
| JP | 5-257281 A | 10/1993 |
| JP | 2001-354756 A | 12/2001 |
| JP | 2002-202609 A | 7/2002 |
| JP | 2007-272193 A | 10/2007 |

OTHER PUBLICATIONS

Koji Arimitsu et al., "Sensitivity Enhancement of Chemical-Amplification-Typo Photoimaging Materials by a Acetoacetic Acid Derivatives", Journal of Photopolymer Science and Technology, vol. 8, No. 1, pp. 43-44, (1995).

Kazuaki Kudo et al., "Enhancement of the Senesitivity of Chemical-Amplification-Type Photoimaging Materials By β-Tosyloxyketone Acetals", Journal of Photopolymer Science and Technology, vol. 8, No. 1, pp. 45-46, (1995).

Koji Arimitsu et al., "Effect of Phenolic Hydroxyl Residues on the Improvement of Acid-Proliferation-Type Photoimaging Materials", Journal of Photopolymer Science and Technology, vol. 9, No. 1, pp. 29-30, (1996).

M. Maenhoudt et al., "Double Patterning Scheme for Sub-0.25 k1 Single Damascene Structures At NA=0.75, λ=193nm", Proceeding of SPIE vol. 5754, p. 1508, (2005).

Masato Shibuya et al., "Performance of Resolution Enhancement Technique Using Both Multiple Exposure and Nonlinear Resist", Japan J. Appl. Phys. vol. 33, pp. 6874-6877, part 1, No. 12B, (1994).

\* cited by examiner

*Primary Examiner* — Sin J. Lee
(74) *Attorney, Agent, or Firm* — Birch, Stewart, Kolasch & Birch, LLP

(57) ABSTRACT

A polymer having a rate of dissolution in an alkaline developer that increases under the action of acid is provided. The polymer is prepared by reacting a hydrogenated ROMP polymer with an O-alkylating agent in the presence of a base.

14 Claims, 1 Drawing Sheet

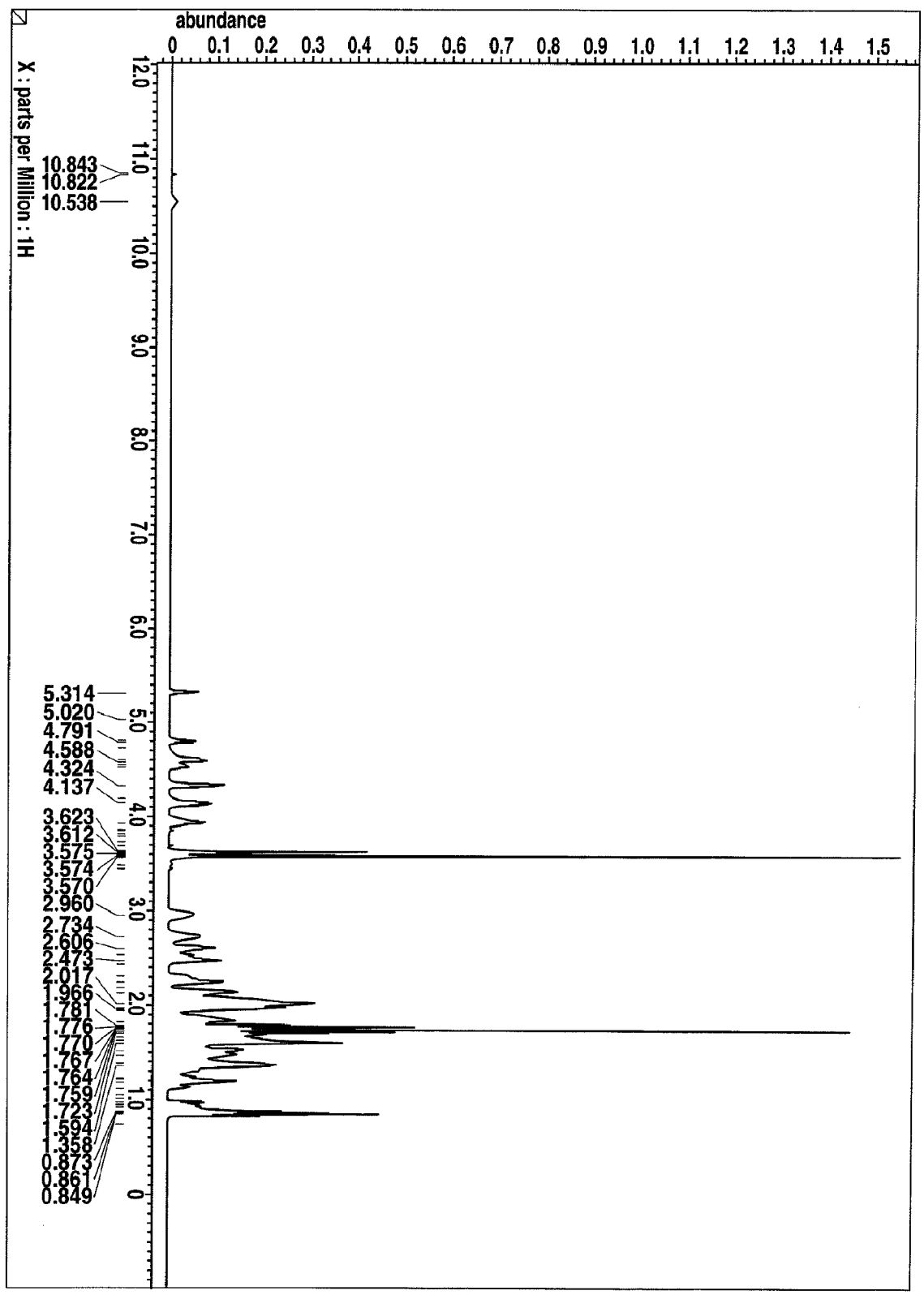

POLYMER, POLYMER PREPARATION METHOD, RESIST COMPOSITION AND PATTERNING PROCESS

CROSS-REFERENCE TO RELATED APPLICATION

This non-provisional application claims priority under 35 U.S.C. §119(a) on Patent Application No. 2008-080605 filed in Japan on Mar. 26, 2008, the entire contents of which are hereby incorporated by reference.

TECHNICAL FIELD

This invention relates to a polymer having a rate of dissolution in an alkaline developer that increases under the action of acid, a method for preparing the polymer, a resist composition comprising the polymer as a base resin, suited for exposure to high-energy radiation of wavelength 300 nm or less (inclusive of excimer lasers), and a patterning process using the resist composition.

BACKGROUND ART

While there is a continuing demand for a finer pattern rule in the drive for higher integration and operating speeds in LSI devices, active efforts have been devoted to develop the microfabrication technology utilizing deep- and vacuum-ultraviolet lithography. In particular, the ArF excimer laser (193 nm) is widely acknowledged as a light source of next generation to the KrF excimer laser and used in photolithography processing advanced semiconductor devices of 90 nm node and forward. While poly-p-hydroxystyrene derivatives played a main role as the base resin in resist compositions of the KrF excimer laser generation, they are difficultly applicable to the photolithography using the ArF excimer laser as the light source because they are opaque to wavelength 193 nm. For the ArF excimer laser photolithography, it is the key factor to search for base resins having transparency.

Poly(meth)acrylic acid and derivatives thereof were considered attractive as the resins which are fully transparent at 193 nm and have relatively satisfactory development properties, but left a problem of dry etching resistance. For improving dry etching resistance, poly(meth)acrylate derivatives having alicyclic structures such as adamantane and norbornane structures incorporated in the pendant ester moiety were developed as described in JP-A 4-39665 and JP-A 5-257281. They became the main stream of development work.

These derivatives, however, are still insufficient in etching resistance. It is expected from the future pattern miniaturization trend that etching resistance will become a factor of more significance because formation of a thinner film of resist is essential to acquire a resolution.

Also proposed in the art are resins having an alicyclic structure as the backbone, for example, polynorbornene derivatives and alternating copolymers of polynorbornene derivatives and maleic anhydride. Although some have sufficient etching resistance, there remains unsolved the problem of poor resolution due to inferior development properties, i.e., swelling and low dissolution contrast during development.

Under these circumstances, a hydrogenated product of ring-opening metathesis polymerization (ROMP) polymer was proposed as meeting high levels of etching resistance and resolution (see JP-A 2002-202609). The hydrogenated ROMP polymer has superior etching resistance to the (meth) acrylate polymers due to an alicyclic skeleton in its backbone and also exhibits good development properties and hence good resolution probably due to a high mobility as compared with other alicyclic polymers. This polymer is thus quite advantageous as the base resin in ArF resist compositions.

Nevertheless, preparation of hydrogenated ROMP polymers requires a high precision level of polymerization and catalyst technology, from which several problems are raised. For example, high purity monomers which are indispensable to polymerization are difficult to prepare, and some monomers having certain functional groups are not susceptible to polymerization. Thus, the monomers which can be used in industrial polymerization are limited to certain structures. In addition, since customers currently have a wide diversity of demands, a wide variety of base resins are necessary to meet such demands. In the case of hydrogenated ROMP polymers, costly labors are needed in the manufacture of a wide variety of polymers because the overall preparation process is relatively long and includes steps each requiring a precise operation.

CITATION LIST

Patent Document 1: JP-A 4-39665
Patent Document 2: JP-A 5-257281
Patent Document 3: JP-A 2002-202609
(U.S. Pat. No. 6,605,408, TW 548516)

SUMMARY OF INVENTION

An object of the invention is to provide a novel polymer, a method for preparing the polymer, a resist composition comprising the polymer which is suited for exposure to high-energy radiation, and a patterning process using the resist composition.

We have discovered that by reacting a hydrogenated ROMP polymer of specific structure which is amenable to industrial manufacture with a specific alkylating agent, a novel polymer can be efficiently prepared which meets all the above-discussed properties of polymers necessary for use as the base resin in resist compositions, specifically optical transmittance to UV and deep-UV (inclusive of excimer lasers), dissolution in alkaline developer, and etching resistance, and which permits some properties to be readily tailored as desired. The polymer is advantageously used as the base resin in resist compositions adapted for exposure to high-energy radiation. This discovery is surprising because polymers of analogous structure are very difficult to manufacture in an industrial scale by the conventional technique.

Accordingly, the invention provides a hydrogenated ROMP polymer having a rate of dissolution in an alkaline developer that increases under the action of acid, a method for preparing the polymer, a resist composition comprising the polymer which is suited for exposure to high-energy radiation, and a patterning process using the resist composition, as defined below.

In a first aspect, the invention provides a polymer having a rate of dissolution in an alkaline developer that increases under the action of acid, represented by the general formula [1].

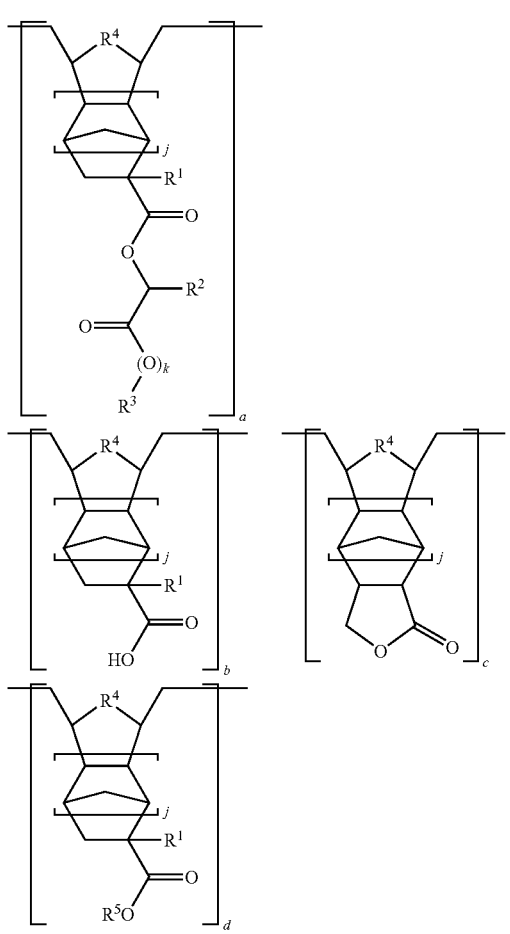

[1]

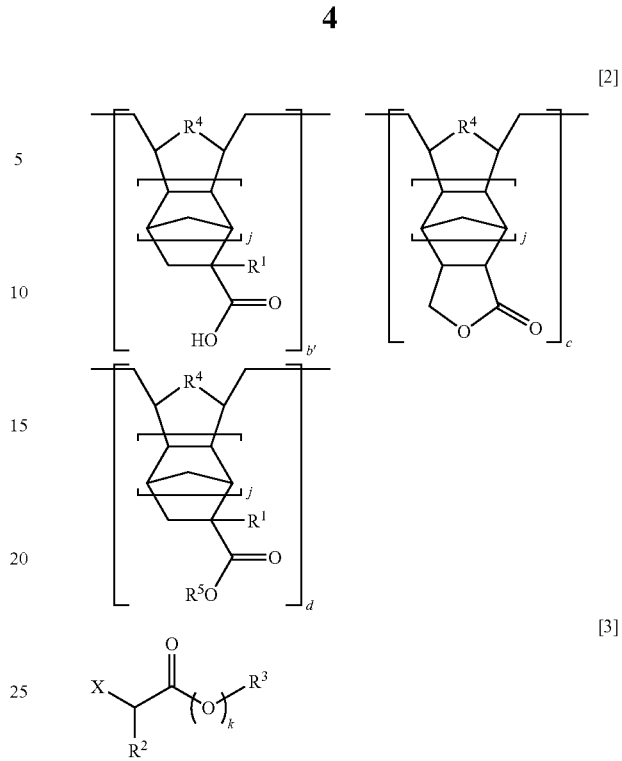

[2]

[3]

Herein a, b, c and d indicative of proportions of the respective recurring units relative to the overall number of recurring units are in the range: 0<a<1, 0≦b<1, 0≦c<1, 0≦d<1, and a+b+c+d=1, j is each independently 0 or 1, k is 0 or 1, $R^1$ is each independently hydrogen or methyl, $R^2$ is hydrogen or may bond with $R^3$ to form a ring with the carbon atoms or the carbon and oxygen atoms to which they are attached wherein $R^2$ and $R^3$ taken together denote a straight, branched or cyclic $C_1$-$C_{20}$ alkylene group which may have an oxygen functional group, $R^3$ is a straight, branched or cyclic $C_1$-$C_{20}$ alkyl group which may have an oxygen functional group such as hydroxyl, ketone, ether, ester, lactone or acetal, $R^4$ is each independently methylene or oxygen, and $R^5$ is a $C_2$-$C_{20}$ acid labile group.

In formula [1], the recurring units included at proportion "a" have a lactone structure in one preferred embodiment; k=0 in another preferred embodiment; k=1 and $R^3$ is a straight, branched or cyclic $C_1$-$C_{20}$ alkyl group having a hydroxyl group in a further preferred embodiment; k=1 and $R^3$ is an acid labile group in a still further preferred embodiment.

In a second aspect, the invention provides a method for preparing a polymer of formula [1] having a rate of dissolution in an alkaline developer that increases under the action of acid as set forth in claim 1, comprising reacting a hydrogenated ring-opening metathesis polymer having the general formula [2] with a compound having the general formula [3] in the presence of a base.

Herein b', c and d indicative of proportions of the respective recurring units relative to the overall number of recurring units are in the range: 0<b'<1, 0≦c<1, 0≦d<1, and b'+c+d=1, j is each independently 0 or 1, k is 0 or 1, $R^1$ is each independently hydrogen or methyl, $R^2$ is hydrogen or may bond with $R^3$ to form a ring with the carbon atoms or the carbon and oxygen atoms to which they are attached wherein $R^2$ and $R^3$ taken together denote a straight, branched or cyclic $C_1$-$C_{20}$ alkylene group which may have an oxygen functional group, $R^3$ is a straight, branched or cyclic $C_1$-$C_{20}$ alkyl group which may have an oxygen functional group such as hydroxyl, ketone, ether, ester, lactone or acetal, $R^4$ is each independently methylene or oxygen, and $R^5$ is a $C_2$-$C_{20}$ acid labile group, and X is a leaving group such as halogen.

In a third aspect, the invention provides a chemically amplified positive resist composition comprising the polymer defined above as a base resin, and more specifically, a chemically amplified positive resist composition comprising (A) the polymer defined above as a base resin, (B) an acid generator, (C) an organic solvent, and optionally (D) a quencher and/or (E) a surfactant.

In a fourth aspect, the invention provides a process for forming a pattern, comprising the steps of (1) applying the resist composition onto a substrate to form a coating, (2) heat treating and exposing the coating to high-energy radiation having a wavelength up to 300 nm or electron beam through a photomask, (3) heat treating and developing the exposed coating with a developer.

ADVANTAGEOUS EFFECTS OF INVENTION

The novel hydrogenated ROMP polymer of the invention can be efficiently prepared by reacting a hydrogenated ROMP polymer of specific structure which is amenable to industrial manufacture with a specific alkylating agent. The polymer meets all the properties necessary for the base resin in resist compositions, specifically optical transmittance to UV and DUV (inclusive of excimer lasers), dissolution in alkaline developer, and etching resistance, and permits some properties to be readily tailored as desired. A method for preparing the polymer, a resist composition comprising the polymer which is suited for exposure to high-energy radiation, and a patterning process using the resist composition are provided as well.

BRIEF DESCRIPTION OF DRAWING

The only FIGURE, FIG. 1 is a diagram showing the $^1$H-NMR spectrum (600 MHz, deuterated THF) of the polymer obtained in Example 1.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group. ROMP denotes ring-opening metathesis polymerization.

While a certain compound is herein represented by a chemical formula, many compounds have a chemical structure for which there can exist enantiomers or diastereomers. Each chemical formula collectively represents all such stereoisomers whether it is either a planar or stereostructural formula. Such stereoisomers may be used alone or in admixture.

Polymer

The invention provides a hydrogenated ROMP polymer comprising structural units [A] having the general formula [4] and optionally, one or more of structural units [B] having the general formula [5], structural units [C] having the general formula [6], and structural units [D] having the general formula [7].

The structural units [A] have the general formula [4].

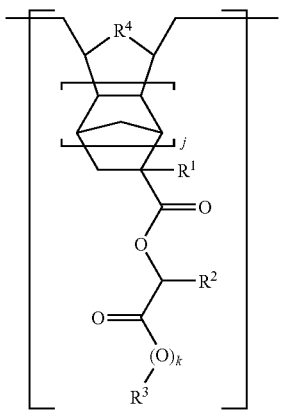

[4]

In formula [4], j and k each are 0 or 1. $R^1$ is hydrogen or methyl. $R^2$ is hydrogen or may bond with $R^3$ to form a ring with the carbon atoms or the carbon and oxygen atoms to which they are attached wherein $R^2$ and $R^3$ taken together denote a straight, branched or cyclic $C_1$-$C_{20}$ alkylene group which may have an oxygen functional group. $R^3$ is a straight, branched or cyclic $C_1$-$C_{20}$ alkyl group which may have an oxygen functional group such as hydroxyl, ketone, ether, ester, lactone or acetal. $R^4$ is methylene or oxygen. Suitable examples of structural units [A] having formula [4] will be illustrated later.

The structural units [B] have the general formula [5].

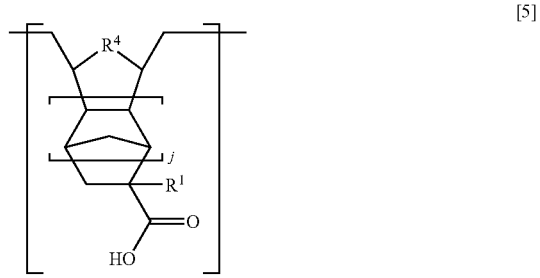

[5]

In formula [5], j is 0 or 1. $R^1$ is hydrogen or methyl. $R^4$ is methylene or oxygen. It is believed that structural units [B] largely contribute to developer affinity, substrate adhesion, and control of acid diffusion length in the inventive resist composition. Specific examples of structural units [B] having formula [5] are illustrated below.

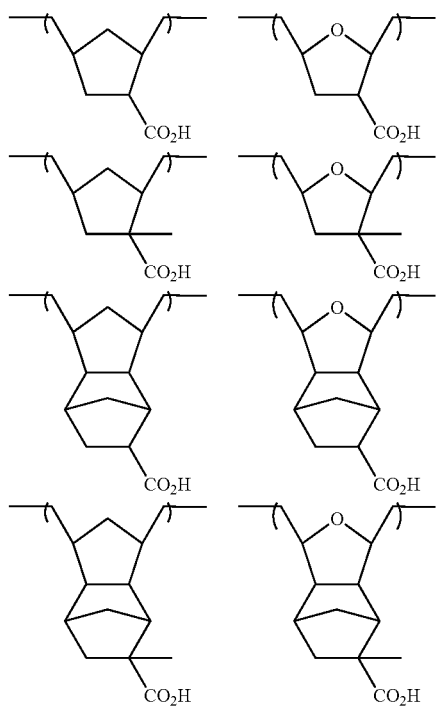

The structural units [C] have the general formula [6].

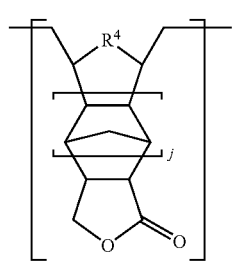

[6]

In formula [6], j is 0 or 1. $R^4$ is methylene or oxygen. It is believed that structural units [C] largely contribute to substrate adhesion and control of acid diffusion length in the inventive resist composition. Specific examples of structural units [C] having formula [6] are illustrated below.

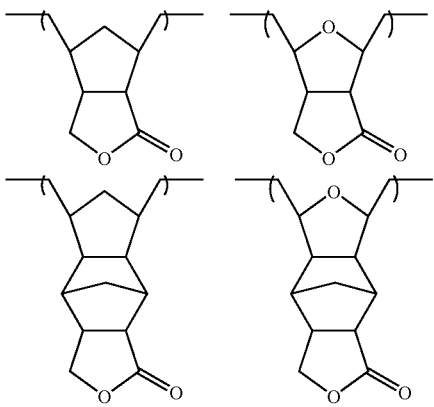

The structural units [D] have the general formula [7].

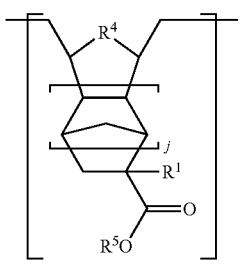

[7]

In formula [7], j is 0 or 1. $R^1$ is hydrogen or methyl. $R^4$ is methylene or oxygen. $R^5$ is a $C_2$-$C_{20}$ acid labile group. Structural units [D] contain an acid labile group, that is, a group which is decomposable with the acid generated by the acid generator upon exposure, to generate a carboxylic acid, and contribute to resist pattern formation via development with aqueous alkaline solution. Specific examples of structural units [D] having formula [7] are illustrated below.

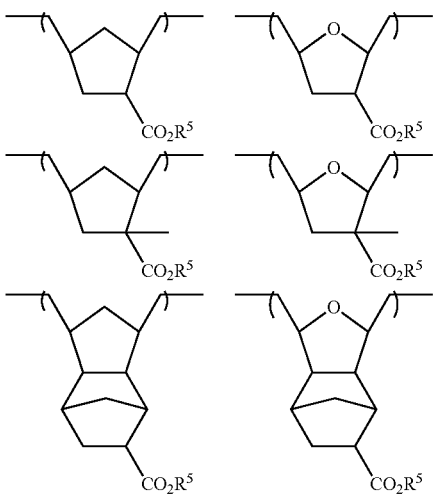

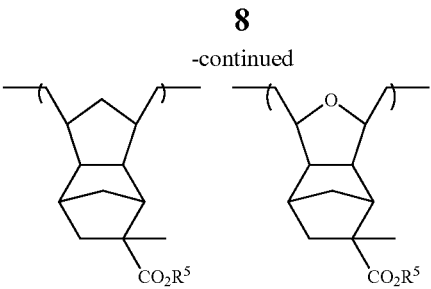

In the foregoing formulae, $R^5$ is a $C_2$-$C_{20}$ acid labile group which is exemplified by the following structural formulae, but not limited thereto. As used herein and throughout the specification, the broken line denotes a bonding site, Me denotes methyl, and Et denotes ethyl.

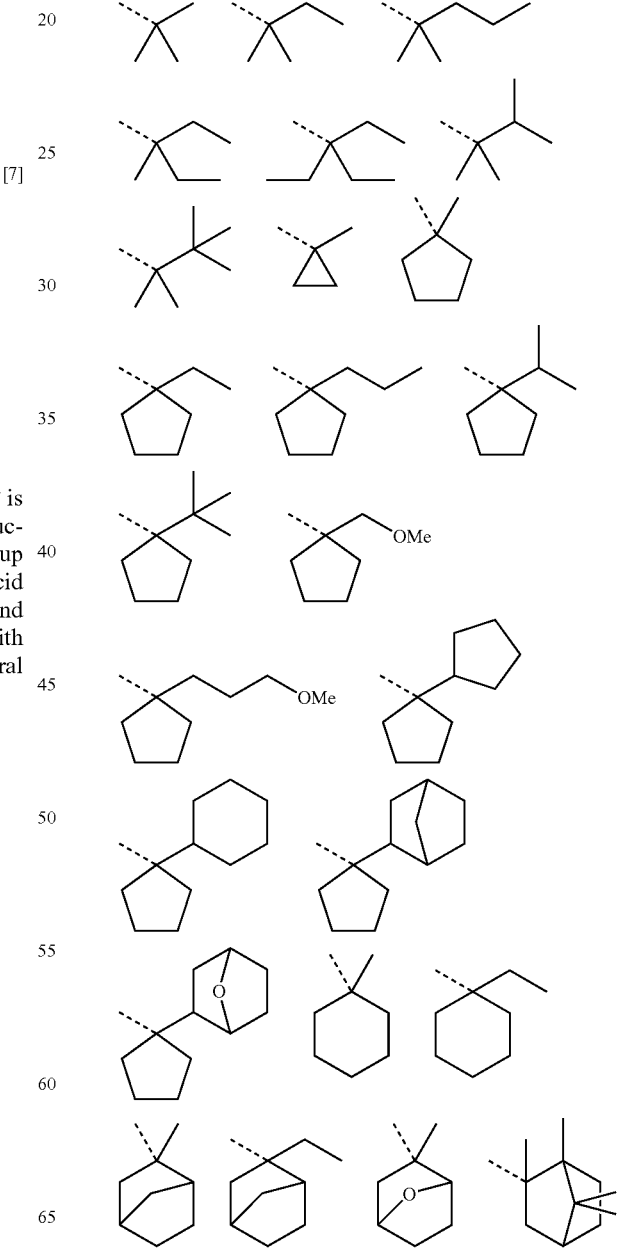

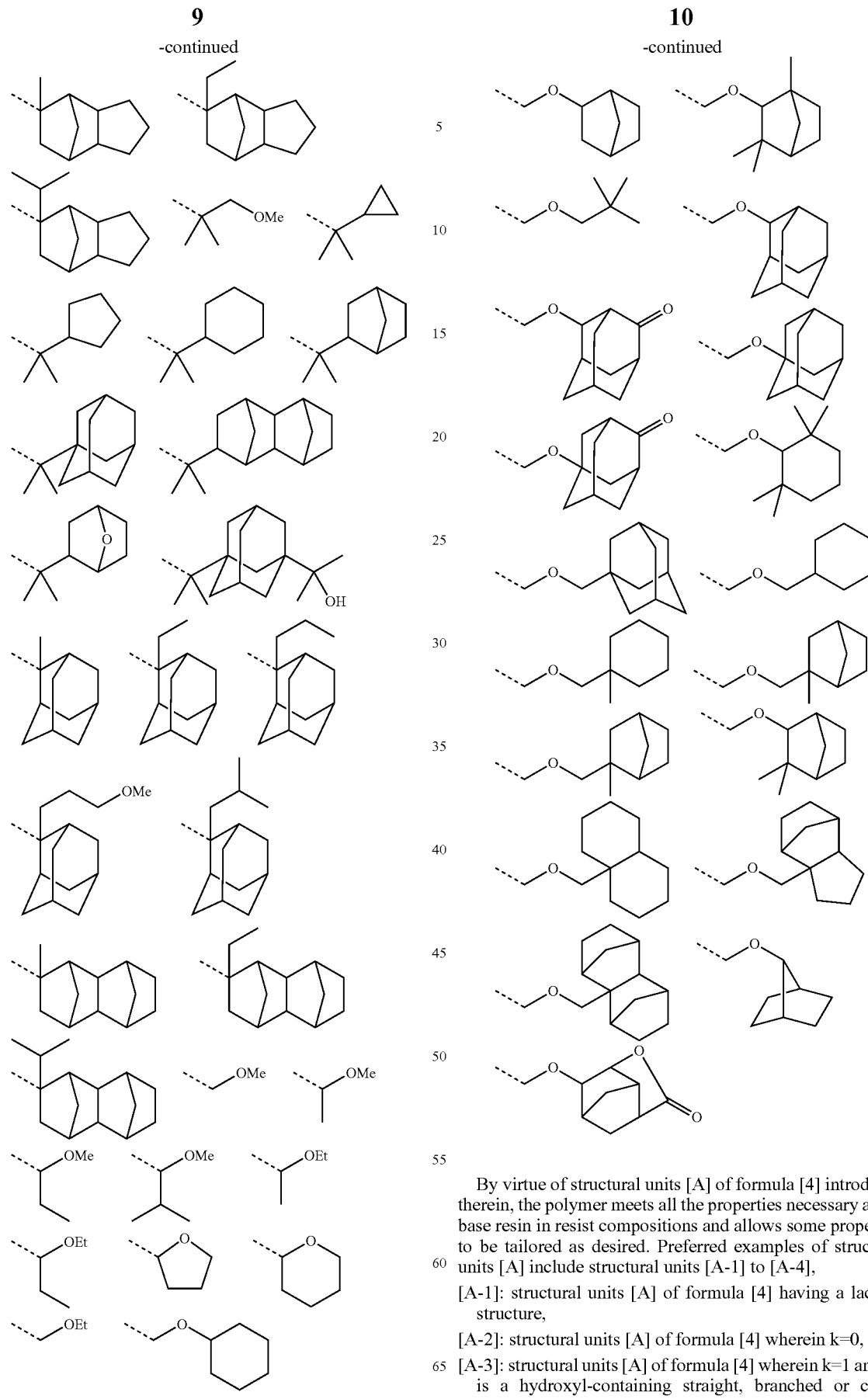

By virtue of structural units [A] of formula [4] introduced therein, the polymer meets all the properties necessary as the base resin in resist compositions and allows some properties to be tailored as desired. Preferred examples of structural units [A] include structural units [A-1] to [A-4],

[A-1]: structural units [A] of formula [4] having a lactone structure,

[A-2]: structural units [A] of formula [4] wherein k=0,

[A-3]: structural units [A] of formula [4] wherein k=1 and $R^3$ is a hydroxyl-containing straight, branched or cyclic $C_1$-$C_{20}$ alkyl group, and

[A-4]: structural units [A] of formula [4] wherein k=1 and $R^3$ is an acid labile group.

As used herein, the "acid labile group" is a technical term generally used in the resist-related art and refers to a group which is deprotected under the action of acid. That is, the acid labile group refers to a protective group for a functional group such as carboxyl or hydroxyl, which may be decomposed or deprotected under the action of acid through elimination reaction, hydrolysis reaction, or substitution reaction.

When $R^3$ denotes an acid labile group, it is a group functioning as an acid labile group selected from the groups defined as $R^3$.

The introduction of structural units [A-1] into a polymer may lead to advantages, for example, reduced risk of fine line pattern collapsing and improved maximum resolution. Examples of structural units [A-1] are given below, but not limited thereto.

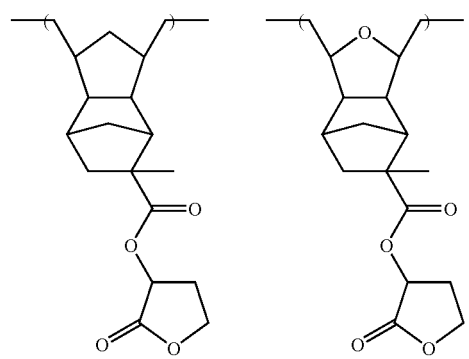

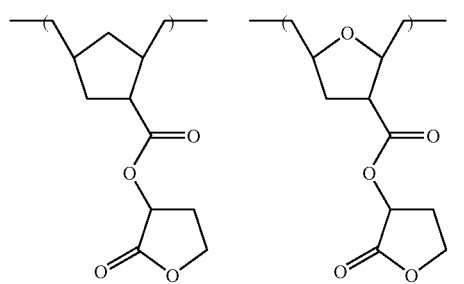

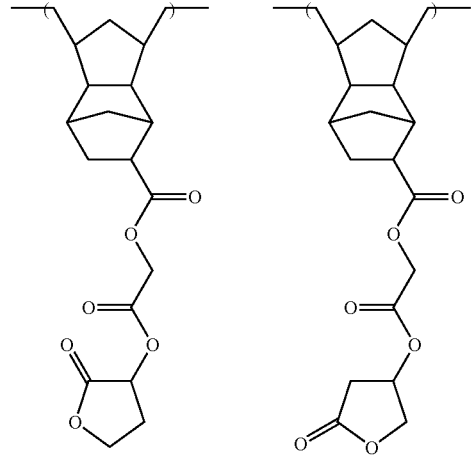

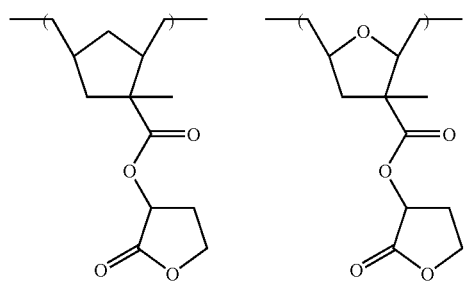

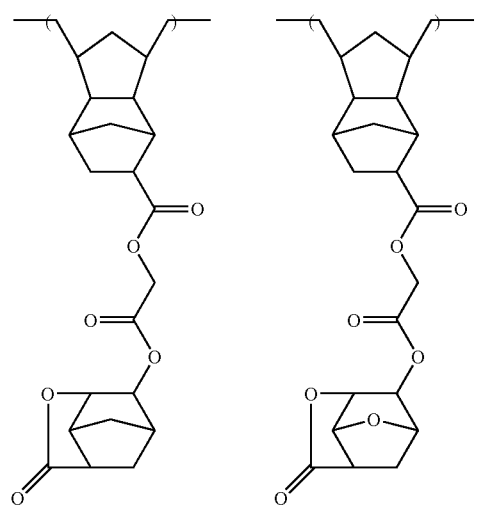

-continued
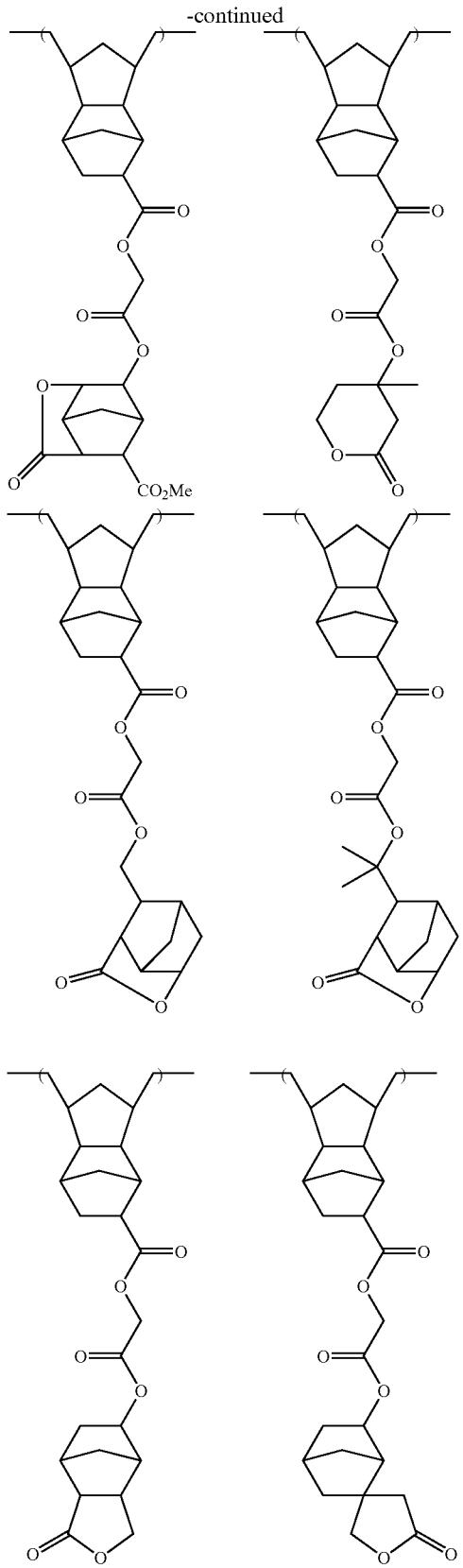
The introduction of structural units [A-2] into a polymer may lead to advantages, for example, clearer definition of spaces in a resist pattern and improved resolution. In some cases, the polymer may be improved in solvent solubility. Examples of structural units [A-2] are given below, but not limited thereto.
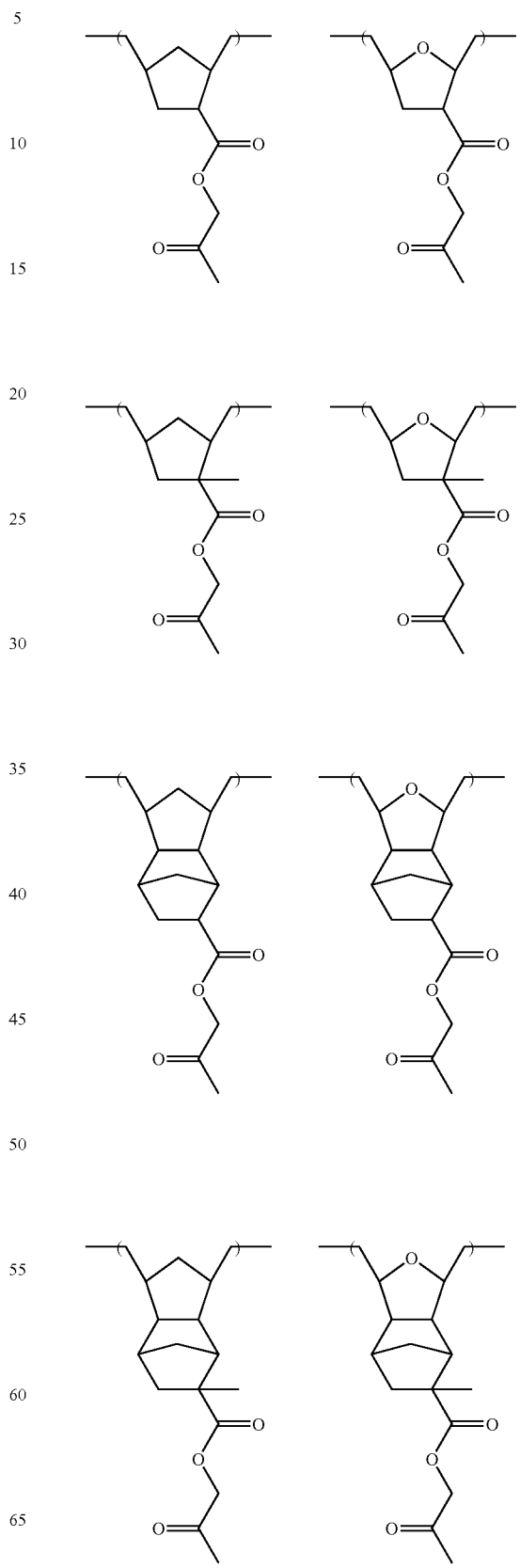

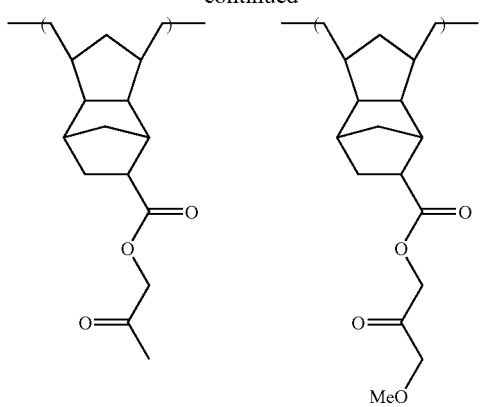
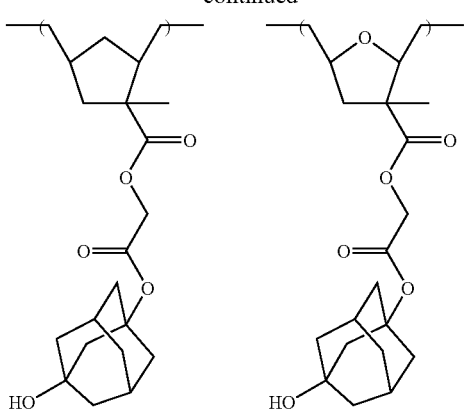
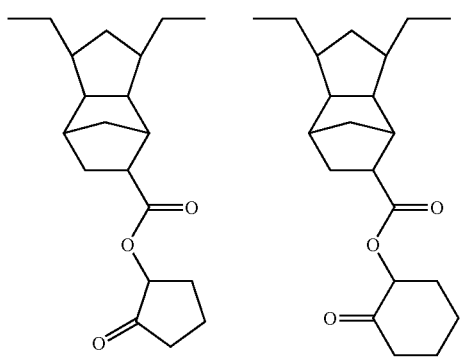
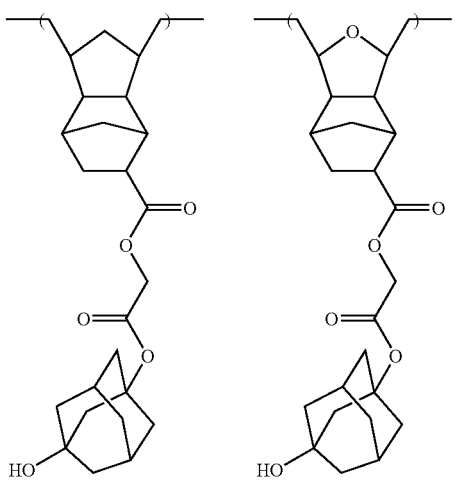
The introduction of structural units [A-3] into a polymer may lead to advantages, for example, improved exposure latitude. Examples of structural units [A-3] are given below, but not limited thereto.
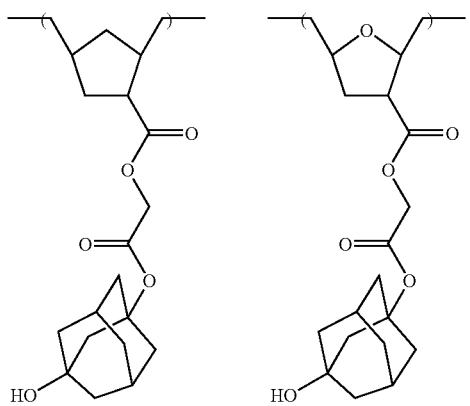
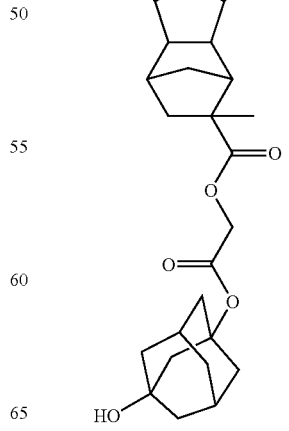

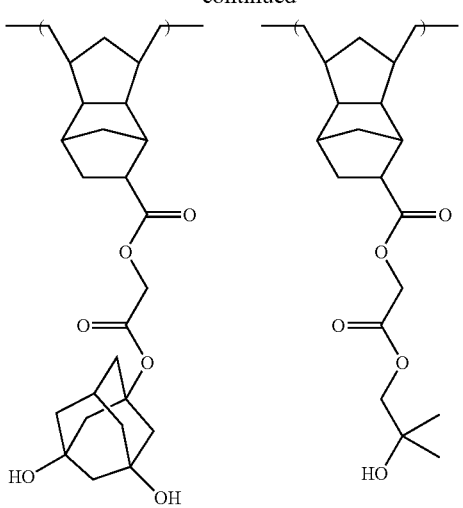

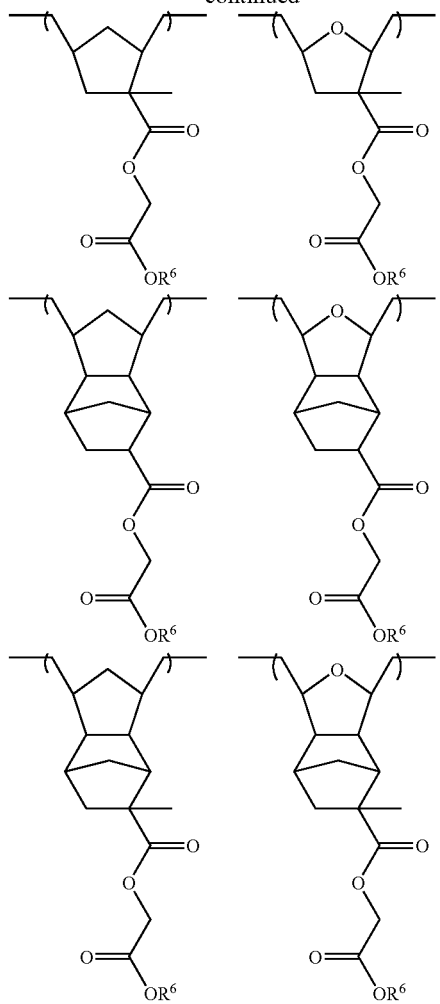

The introduction of structural units [A-4] into a polymer may lead to advantages, for example, improved line edge roughness (LER). When structural units [A-4] are included together with units [D], acid labile groups of different reactivity can be assigned to units [A-4] and [D], respectively. This advantageously increases the freedom of polymer design in terms of decomposition upon exposure, control of developing properties, control of thermal properties, and solvent solubility. Examples of structural units [A-4] are given below, but not limited thereto. In the formulae, $R^6$ denotes an acid labile group.

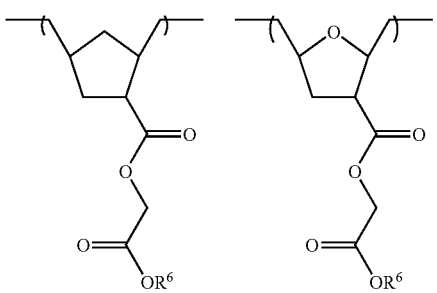

The acid labile group of $R^6$ is exemplified below, but not limited thereto.

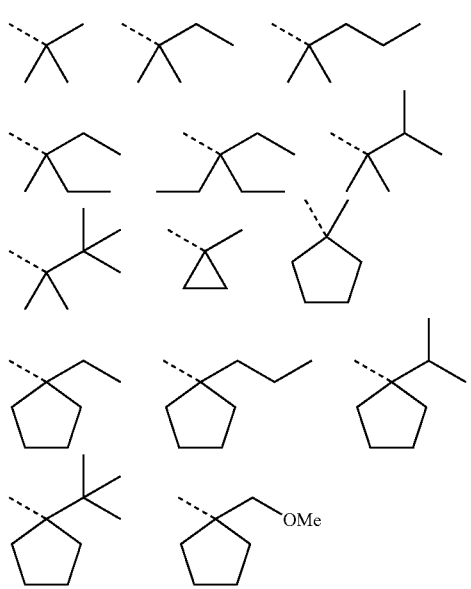

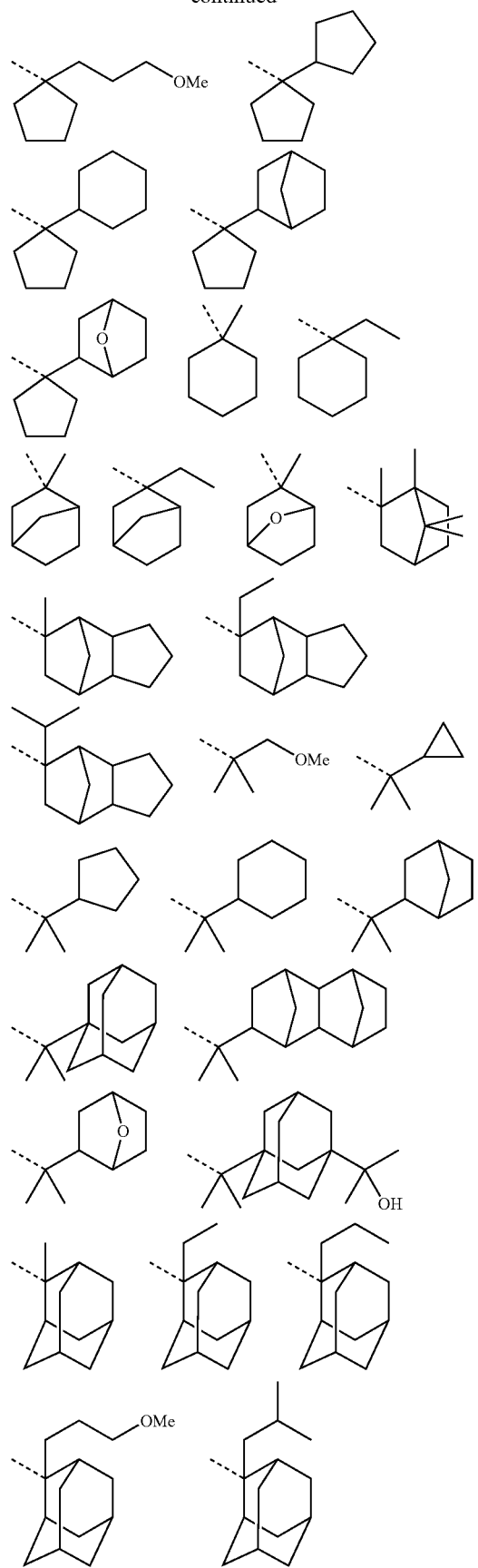
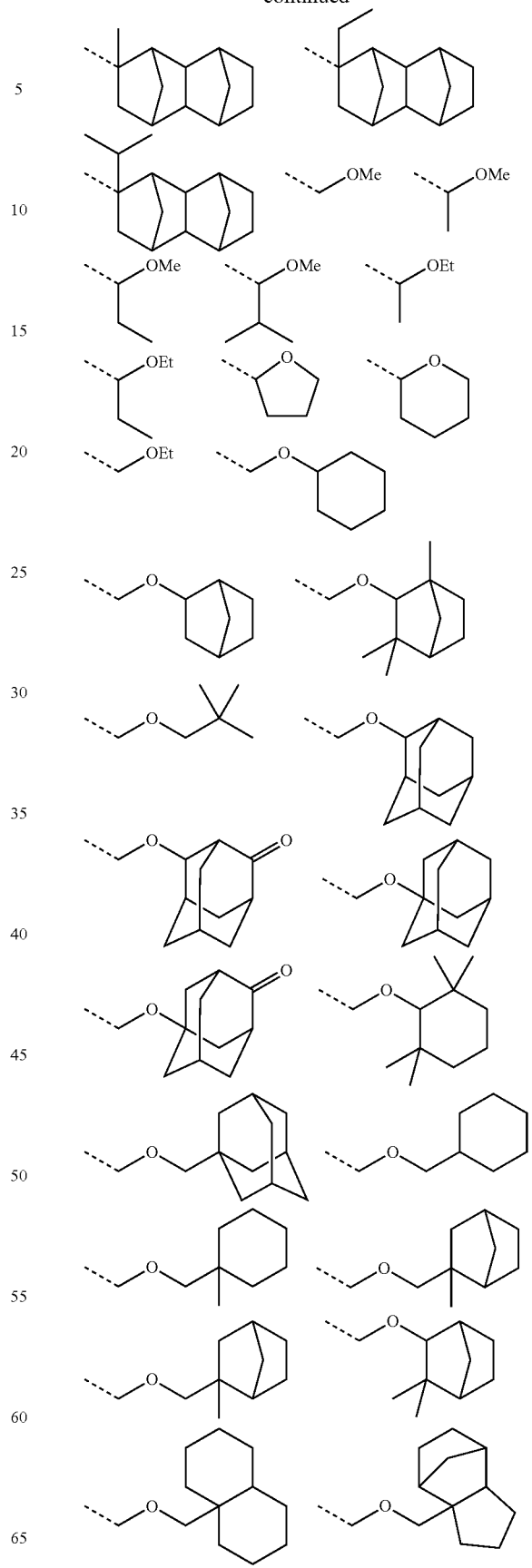

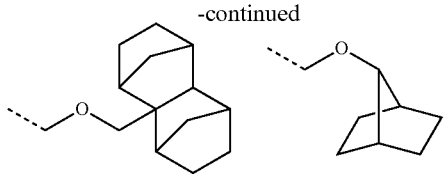

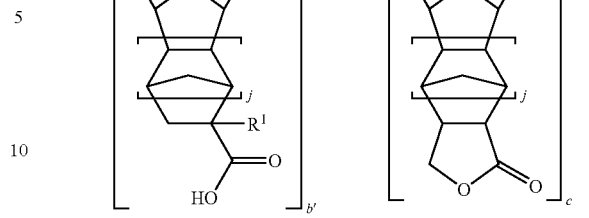

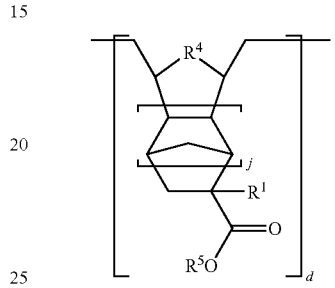

In formula [1], a, b, c and d indicative of proportions of the respective recurring units relative to the overall number of recurring units are in the range: $0<a<1$, $0\leq b<1$, $0\leq c<1$, $0\leq d<1$, and $a+b+c+d=1$. That is, the inclusion of at least structural units [A] of formula [4] is essential. Preferably a, b, c and d are in the range: $0<a\leq 0.6$, $0\leq b\leq 0.3$, $0\leq c\leq 0.7$, $0\leq d\leq 0.7$, and more preferably $0<a\leq 0.5$, $0<b\leq 0.2$, $0\leq c\leq 0.6$, $0\leq d\leq 0.6$.

In the polymer, each of structural units [A] to [D] may be units of one type, or either one or more or even all of structural units [A] to [D] may consist of units of more than one type. It is preferred that among a plurality of $R^4$ in formulae [4] to [7] corresponding to all these structural units [A] to [D], at least one $R^4$ be an oxygen atom. The inclusion of an oxygen atom in the backbone-forming alicyclic compound is not only effective for improving the adhesion of the polymer to silicon or other substrates to be coated therewith, wetting tension upon development with an aqueous alkaline solution, and the solubility of the polymer in polar organic solvents (e.g., ketones and alcohols) used in the step of applying the resist composition to silicon wafers, but also effective for improving affinity to water and development with a stripping agent or developer (e.g., aqueous alkaline solution) following exposure. A proportion of oxygen as $R^4$ is 0 to 99 mol %, preferably 2 to 95 mol %, more preferably 5 to 80 mol %, and most preferably 10 to 70 mol %, based on the overall structural units.

The hydrogenated ROMP polymers typically have a weight average molecular weight (Mw) of 500 to 200,000, preferably 2,000 to 200,000, and more preferably 3,000 to 30,000. Preferably the polymers have a dispersity (Mw/Mn) of 1.0 to 5.0. It is noted that the weight average molecular weight (Mw) and number average molecular weight (Mn) of a polymer sample are determined by gel permeation chromatography (GPC) using a solvent capable of dissolving the sample, a column capable of separating the sample, and polystyrene standards. The dispersity, also known as molecular weight distribution, is defined as weight average molecular weight (Mw) divided by number average molecular weight (Mn), i.e., Mw/Mn.

The polymer having a rate of dissolution in an alkaline developer that increases under the action of acid, represented by the general formula [1], can be efficiently prepared by reacting a hydrogenated ROMP polymer having the general formula [2] with a compound having the general formula [3] in the presence of a base.

In formulae [2] and [3], b', c and d indicative of proportions of the respective recurring units relative to the overall number of recurring units are in the range: $0<b'<1$, $0\leq c<1$, $0\leq d<1$, and $b'+c+d=1$. These subscripts are preferably in the range: $0<b'\leq 0.9$, $0\leq c\leq 0.7$, $0\leq d\leq 0.7$, and more preferably $0<b'\leq 0.7$, $0\leq c\leq 0.6$, $0\leq d\leq 0.6$. The subscript j is each independently 0 or 1, and k is 0 or 1. $R^1$ is each independently hydrogen or methyl. $R^2$ is hydrogen or may bond with $R^3$ to form a ring with the carbon atoms or the carbon and oxygen atoms to which they are attached. In the latter case, $R^2$ and $R^3$ taken together denote a straight, branched or cyclic $C_1$-$C_{20}$ alkylene group which may have an oxygen functional group. $R^3$ is a straight, branched or cyclic $C_1$-$C_{20}$ alkyl group which may have an oxygen functional group such as hydroxyl, ketone, ether, ester, lactone or acetal. $R^4$ is each independently methylene or oxygen. $R^5$ is a $C_2$-$C_{20}$ acid labile group. X is a leaving group such as halogen (e.g., chloro, bromo, iodo), alkanesulfonyloxy or arenesulfonyloxy.

The recurring units included in a proportion b' in formula [2] correspond to structural units [B], with their examples being as exemplified above. The recurring units included in a proportion c in formula [2] correspond to structural units [C], with their examples being as exemplified above. The recurring units included in a proportion d in formula [2] correspond to structural units [D], with their examples being as exemplified above.

Examples of the compound having formula [3] are given below, but not limited thereto. In the formulae, $R^6$ is an acid labile group, examples of which are as exemplified above.

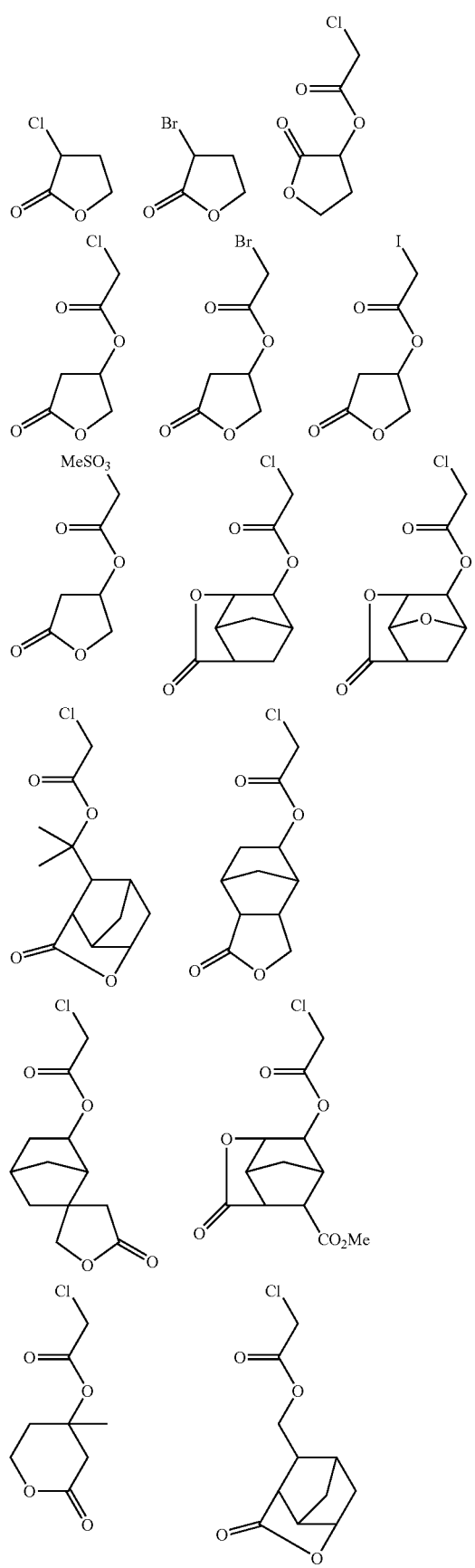

The hydrogenated ROMP polymer having formula [2] may be prepared, for example, by providing cyclic olefin monomers corresponding to structural units [B] of formula [5], structural units [C] of formula [6], and structural units [D] of formula [7], polymerizing the monomers in the presence of a ring-opening metathesis catalyst, and hydrogenating in the presence of a hydrogenation catalyst.

The method of preparing the hydrogenated ROMP polymer having formula [2] is not particularly limited. For example, polymerization and hydrogenation may be carried out by the techniques described in JP-A 2001-354756 and JP Appln. No. 2007-272193 (U.S. Ser. No. 12/252,123). In the polymerization reaction, any suitable catalyst may be used as long as it helps ring-opening metathesis polymerization of the foregoing cyclic olefin monomers. In the hydrogenation reaction, any suitable catalyst may be used as long as it helps hydrogenation on polymers resulting from the ring-opening metathesis polymerization. The hydrogenated ROMP polymers having formula [2] are obtained by producing ROMP polymers through the polymerization of cyclic olefin monomers in the presence of a ROMP catalyst, and hydrogenating the ROMP polymers under hydrogen pressure in a solvent in the presence of a hydrogenation catalyst. If desired, the hydrogenated ROMP polymers thus obtained may be subjected to acid treatment whereby some or all acid labile groups are deprotected to generate carboxylic acid.

The polymer having formula [1] may be prepared, as shown by the following reaction scheme, by causing an alkylating agent having formula [3] and a base to act on the hydrogenated ROMP polymer having formula [2] in a solvent for effecting O-alkylating reaction.

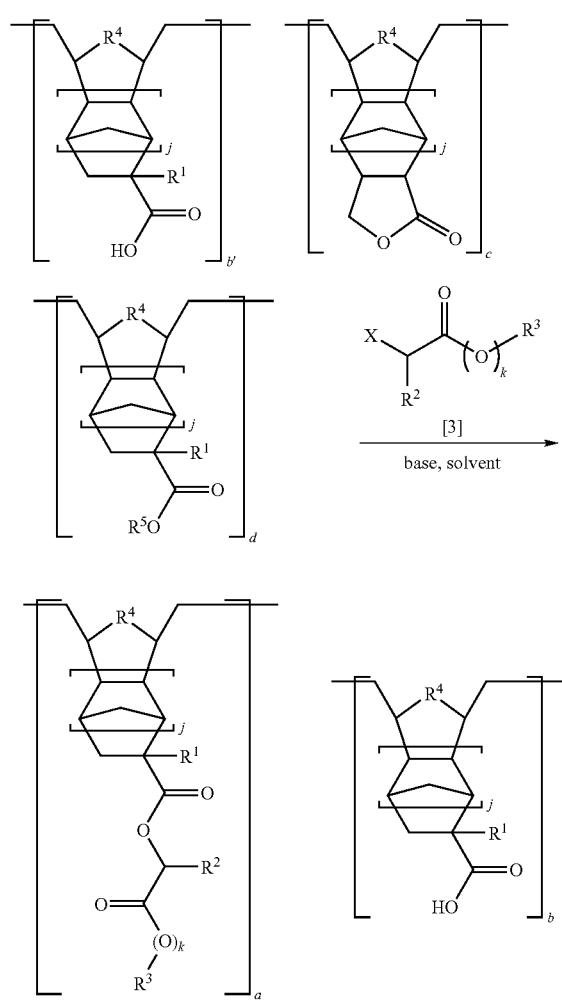

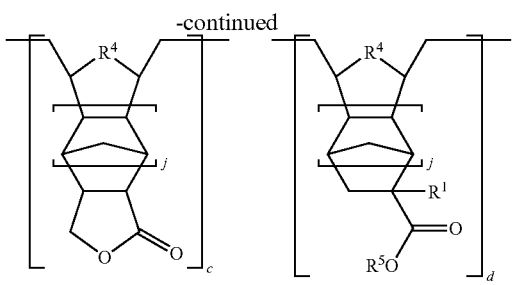

Herein, a, b, b', c, d, j, k, $R^1$ to $R^5$, and X are as defined above.

In the O-alkylating reaction, the alkylating agent [3] is preferably used in an amount of 1.0 to 2.0 moles, more preferably 1.0 to 1.3 moles provided that the desired amount of the agent introduced is 1 mole. The solvent used herein is not particularly limited as long as the polymers having formulae [1] and [2] can be dissolved therein. Preferred examples of the solvent include hydrocarbons such as toluene; ethers such as diethylene glycol diethyl ether, diethylene glycol dimethyl ether, and tetrahydrofuran; ketones such as acetone, 2-butanone, cyclohexanone, and 4-methyl-2-pentanone; alcohols such as diethylene glycol monomethyl ether and propylene glycol monomethyl ether; esters such as ethyl acetate, propylene glycol monomethyl ether acetate (PGMEA), and γ-butyrolactone; and aprotic polar solvents such as N,N-dimethylformamide, N,N-dimethylacetamide, dimethyl sulfoxide and N-methylpyrrolidone, alone or in admixture. Suitable bases used herein include metal hydroxides such as sodium hydroxide and potassium hydroxide; metal alkoxides such as sodium methoxide and potassium t-butoxide; organometallic compounds such as butyllithium and ethylmagnesium bromide; metal salts such as potassium carbonate and sodium carbonate; and organic bases such as pyridine, triethylamine and diisopropylethylamine, alone or in admixture. The base is preferably used in an amount of 0.8 to 5.0 moles, and more preferably 0.9 to 2.0 moles per mole of alkylating agent [3]. The O-alkylating reaction runs preferably at a temperature from −20° C. to around the boiling point of the solvent used although an appropriate temperature may be selected depending on other reaction conditions. The time of O-alkylating reaction generally varies from about 2 hours to about 100 hours although it is recommended to carry out a preliminary experiment to estimate a time necessary to achieve the desired rate of introduction. The reaction is followed by standard aqueous work-up to remove the salt resulting from the reaction, obtaining the desired polymer [1]. If necessary, the polymer [1] may be purified by a standard technique such as re-precipitation or liquid separation.

In an alternative method of preparing the polymer [1], a monomer corresponding to structural units [A] may be introduced from the first through polymerization reaction. However, the foregoing method is most preferred because structural units [A] can be introduced in any desired proportion and at an acceptable cost.

Resist Composition

The resist composition comprising the hydrogenated ROMP polymer of the specific structure according to the invention as a base resin is useful as a positive working resist composition, especially chemically amplified positive working resist composition. In addition to the hydrogenated ROMP polymer as a base resin, the composition contains essentially (B) a compound capable of generating an acid in response to high-energy radiation or electron beam (known as acid generator) and (C) an organic solvent and optionally, (D)

a compound capable of suppressing acid diffusion within a resist film (known as quencher) and (E) a surfactant.

Acid Generator

In the resist composition of the invention, an acid generator is generally included. A typical acid generator is a photoacid generator (PAG) which may be any compound capable of generating an acid in response to high-energy radiation such as UV, deep-UV, electron beam, X-ray, excimer laser, γ-ray and synchrotron radiation. Suitable photoacid generators include sulfonium salts, iodonium salts, sulfonyldiazomethane, N-sulfonyloxydicarboximide, O-arylsulfonyloxime and O-alkylsulfonyloxime acid generators. Exemplary photoacid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris (3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl(2-naphthyl) sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy) naphthalene-2-sulfonate, 4-(p-toluenesulfonyloxy) naphthalene-1-sulfonate, 5-(p-toluenesulfonyloxy) naphthalene-1-sulfonate, 8-(p-toluenesulfonyloxy) naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Exemplary bis(substituted alkylsulfonyl)imides include bis (trifluoromethylsulfonyl)imide, bis(pentafluoroethylsulfonyl)imide, bis(heptafluoropropylsulfonyl)imide, and perfluoro(1,3-propylenebissulfonyl)imide. A typical tris (substituted alkylsulfonyl)methide is tris (trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations include diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Exemplary bis(substituted alkylsulfonyl)imides include bis (trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-(methanesulfonyloxy)phenylsulfonyl)diazomethane, bis(4-(p-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazo-methane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxydicarboximide photoacid generators include combinations of imide skeletons with sulfonates. Exemplary imide skeletons are succinimide, naphthalenedicarboximide, phthalimide, cyclohexyldicarboximide, 5-norbornene-2,3-dicarboximide, and 7-oxabicyclo[2.2.1]-5-heptene-2,3-dicarboximide. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)

naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropane-sulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-(trifluoromethyl)benzenesulfonyl)-nioxime, and bis-O-(xylenesulfonyl)-nioxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropane-sulfonate, 2-naphthoyloxy-1,1,3,3,3-pentafluoropropane-sulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Photoacid generators in the form of oxime sulfonates with a long conjugated system separated by thiophene or cyclohexadiene include (5-(p-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile,
(5-n-octanesulfonyloxyimino-5H-thiophen-2-ylidene)phenyl-acetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methyl-phenyl)acetonitrile,
(5-(4-(p-toluenesulfonyloxy)benzenesulfonyl)oxyimino-5H-thiophen-2-ylidene)phenylacetonitrile, and
(5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propane-sulfonate,
1,1,3,3,3-pentafluoro-2-pivaloyloxypropanesulfonate,
2-cyclohexanecarbonyloxy-1,1,3,3,3-pentafluoropropane-sulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropane-sulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Suitable oxime sulfonates having an electron withdrawing group such as trifluoromethyl incorporated for increased stability include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)oxime, 2,2,2-trifluoro-1-phenyl-ethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphor-sulfonyl)oxime, 2,2,2-trifluoro-1-(4-methylphenyl)ethanone O-(methylsulfonyl)oxime, 2,2,2-trifluoro-1-(2-methylphenyl)-ethanone O-(10-camphorsulfonyl)oxime, 2,2,2-trifluoro-1-(2,4-dimethylphenyl)ethanone O-(10-camphorsulfonyl)oxime, 2,2,2-trifluoro-1-(2,4-dimethylphenyl)ethanone O-(1-naphthylsulfonyl)oxime, 2,2,2-trifluoro-1-(2,4-dimethylphenyl)-ethanone O-(2-naphthylsulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethyl-phenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)-ethanone O-(methyl-sulfonyl)oxime, 2,2,2-trifluoro-1-(3,4-dimethoxyphenyl)-ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxy-phenylsulfonyl)oxime, 2,2,2-trifluoro-1-(4-methoxyphenyl)-ethanone O-(4-dodecylphenylsulfonyl)oxime, 2,2,2-trifluoro-1-(4-methoxyphenyl)ethanone O-(octylsulfonyl)oxime, 2,2,2-trifluoro-1-(4-thiomethylphenyl)ethanone O-(4-methoxy-phenylsulfonyl)oxime, 2,2,2-trifluoro-1-(4-thiomethylphenyl)-ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)-ethanone O-(phenylsulfonyl)oxime, 2,2,2-trifluoro-1-(4-chlorophenyl)ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)-ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl) ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)-ethanone O-(propylsulfonyl) oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methyl-carbonyloxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxy-carbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)-oxime, 2,2,2-trifluoro-1-(4-benzyloxyphenyl)ethanone O-(propylsulfonyl)oxime, 2,2,2-trifluoro-1-(2-thiophenyl)-ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoro-methanesulfonyloxyimino)ethyl)phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino) ethyl)-phenoxy)propoxy)phenyl)ethanone O-(propylsulfonyl)oxime, 2,2,2-trifluoro-1-(4-(3-(4-(2,2,2-trifluoro-1-(1-butane-sulfonyloxyimino)ethyl)phenoxy)propoxy)phenyl)ethanone O-(butylsulfonyl)oxime, 2,2,2-trifluoro-1-(4-(3-(4-(2,2,2-trifluoro-1-(4-(4-methylphenylsulfonyloxy)phenylsulfonyl-oxyimino)ethyl)phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-(2,5-bis(4-methylphenylsulfonyloxy)benzenesulfonyloxy) phenylsulfonyloxy-imino)ethyl)phenoxy)propoxy)phenyl) ethanone O-(2,5-bis(4-methylphenylsulfonyloxy) benzenesulfonyloxy)phenylsulfonyl)-oxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1, 1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoro-propanesulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-tosyloxyethanesulfonate, adamantanemethoxy-carbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoro-methanesulfonate, and 4-oxo-1-adamantyloxycarbonyldifluoro-methanesulfonate.

Also included are oxime sulfonates having the formula (Ox-1):

(Ox-1)

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is substituted or unsubstituted aromatic or hetero-aromatic group. Examples include 2-[2,2,3,3,4,4,5,5-octafluoro-1-(nonafluorobutylsulfonyloxy-imino)-pentyl]fluorene, 2-[2,2,3,3,4,4-pentafluoro-1-(nonafluorobutylsulfonyloxy-imino)-butyl]fluorene, 2-[2,2,3,3,4,4,5,5,6,6-decafluoro-1-(nonafluorobutylsulfonyl-oxyimino)-hexyl]fluorene, 2-[2,2,3,3,4,4,5,5-octafluoro-1-(nonafluorobutylsulfonyloxy-imino)-pentyl]-4-biphenyl, 2-[2,2,3,3,4,4-pentafluoro-1-(nonafluorobutylsulfonyloxy-imino)-butyl]-4-biphenyl, and 2-[2,2,3,3,4,4,5,5,6,6-decafluoro-1-(nonafluorobutylsulfonyl-oxyimino)-hexyl]-4-biphenyl. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Suitable oxime sulfonate generators using substituted acetonitrile derivatives include
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylaceto-nitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]aceto-nitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yloxy-carbonyl)difluoromethanesulfonate, and
4-oxo-1-adamantyloxycarbonyldifluoromethanesulfonate.

Suitable bisoxime sulfonates include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediaceto-nitrile, bis(α-(4-methoxybenzenesulfonyloxy)imino)-p-phenylenediaceto-nitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediaceto-nitrile, bis(α-(trifluoromethanesulfonyloxy)imino)-m-phenylenediaceto-nitrile, bis(α-(4-methoxybenzenesulfonyloxy)imino)-m-phenylenediaceto-nitrile, etc. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-(1-adamantanecarbonyloxy)-1,1,3,3,3-pentafluoropropane-sulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

When the photoacid generator (B) is added to the KrF excimer laser resist composition, preference is given to sulfonium salts, bissulfonyldiazomethanes, N-sulfonyloxyimides and oxime-O-sulfonates. Illustrative preferred photoacid generators include
triphenylsulfonium p-toluenesulfonate,
triphenylsulfonium camphorsulfonate,
triphenylsulfonium pentafluorobenzenesulfonate,
triphenylsulfonium nonafluorobutanesulfonate,
triphenylsulfonium 4-(p-toluenesulfonyloxy)benzenesulfonate,
triphenylsulfonium 2,4,6-triisopropylbenzenesulfonate,
4-tert-butoxyphenyldiphenylsulfonium p-toluenesulfonate,
4-tert-butoxyphenyldiphenylsulfonium camphorsulfonate,
4-tert-butoxyphenyldiphenylsulfonium 4-(p-toluenesulfonyl-oxy)benzenesulfonate, 4-tert-butylphenyldiphenylsulfonium camphorsulfonate,
tris(4-methylphenyl)sulfonium camphorsulfonate,
tris(4-tert-butylphenyl)sulfonium camphorsulfonate,
bis(tert-butylsulfonyl)diazomethane,
bis(cyclohexylsulfonyl)diazomethane,
bis(2,4-dimethylphenylsulfonyl)diazomethane,
bis(4-n-hexyloxyphenylsulfonyl)diazomethane,
bis(2-methyl-4-n-hexyloxyphenylsulfonyl)diazomethane,
bis(2,5-dimethyl-4-n-hexyloxyphenylsulfonyl)diazomethane,
bis(3,5-dimethyl-4-n-hexyloxyphenylsulfonyl)diazomethane,
bis(2-methyl-5-isopropyl-4-n-hexyloxy)phenylsulfonyl-diazo-methane,
bis(4-tert-butylphenylsulfonyl)diazomethane,
N-camphorsulfonyloxy-5-norbornene-2,3-dicarboxylic acid imide,
N-p-toluenesulfonyloxy-5-norbornene-2,3-dicarboxylic acid imide,
(5-(10-camphorsulfonyl)oxyimino-5H-thiophen-2-ylidene)(2-methylphenyl)acetonitrile, and
(5-(p-toluenesulfonyl)oxyimino-5H-thiophen-2-ylidene)(2-methylphenyl)acetonitrile.

When the photoacid generator (B) is added to the ArF laser resist composition, preference is given to sulfonium salts and oxime-O-sulfonates. Illustrative preferred photoacid generators include
triphenylsulfonium trifluoromethanesulfonate,
triphenylsulfonium pentafluoroethanesulfonate,
triphenylsulfonium heptafluoropropanesulfonate,
triphenylsulfonium nonafluorobutanesulfonate,
triphenylsulfonium tridecafluorohexanesulfonate,
triphenylsulfonium heptadecafluorooctanesulfonate,
triphenylsulfonium perfluoro(4-ethylcyclohexane)sulfonate,
4-methylphenyldiphenylsulfonium nonafluorobutanesulfonate,
2-oxo-2-phenylethylthiacyclopentanium nonafluorobutanesulfonate,
4-tert-butylphenyldiphenylsulfonium nonafluorobutanesulfonate,
4-tert-butylphenyldiphenylsulfonium perfluoro(4-ethylcyclohexane)sulfonate,
4-tert-butylphenyldiphenylsulfonium heptafluorooctane-sulfonate,
triphenylsulfonium 1,1-difluoro-2-naphthylethanesulfonate,
triphenylsulfonium 1,1,2,2-tetrafluoro-2-(norbornan-2-yl)-ethanesulfonate,
triphenylsulfonium 2-benzoyloxy-1,1,3,3,3-pentafluoropropane-sulfonate,
triphenylsulfonium 1,1,3,3,3-pentafluoro-2-(pivaloyloxy)-propanesulfonate,
triphenylsulfonium 2-(cyclohexanecarbonyloxy)-1,1,3,3,3-pentafluoropropanesulfonate,
triphenylsulfonium 2-(2-naphthoyloxy)-1,1,3,3,3-pentafluoro-propanesulfonate,
triphenylsulfonium 2-(1-adamantanecarbonyloxy)-1,1,3,3,3-pentafluoropropanesulfonate,
triphenylsulfonium 2-hydroxy-1,1,3,3,3-pentafluoropropane-sulfonate,
triphenylsulfonium adamantanemethoxycarbonyldifluoromethane-sulfonate,
triphenylsulfonium 1-(3-hydroxymethyladamantane)methoxy-carbonyldifluoromethanesulfonate,
triphenylsulfonium methoxycarbonyldifluoromethanesulfonate,
4-tert-butylphenyldiphenylsulfonium 2-benzoyloxy-1,1,3,3,3-pentafluoropropanesulfonate,
4-tert-butylphenyldiphenylsulfonium 1,1,3,3,3-pentafluoro-2-(pivaloyloxy)propanesulfonate,
4-tert-butylphenyldiphenylsulfonium 2-(cyclohexanecarbonyl-oxy)-1,1,3,3,3-pentafluoropropanesulfonate,
4-tert-butylphenyldiphenylsulfonium 2-(2-naphthoyloxy)-1,1,3,3,3-pentafluoropropanesulfonate,
4-tert-butylphenyldiphenylsulfonium 2-(1-adamantanecarbonyl-oxy)-1,1,3,3,3-pentafluoropropanesulfonate,
4-tert-butylphenyldiphenylsulfonium 2-hydroxy-1,1,3,3,3-pentafluoropropanesulfonate,
4-tert-butylphenyldiphenylsulfonium adamantanemethoxycarbonyldifluoromethanesulfonate,
4-tert-butylphenyldiphenylsulfonium 1-(3-hydroxymethyladamantane)methoxycarbonyldifluoromethanesulfonate,
4-tert-butylphenyldiphenylsulfonium methoxycarbonyldifluoro-methanesulfonate,
2-oxo-2-phenylethylthiacyclopentanium 2-benzoyloxy-1,1,3,3,3-pentafluoropropanesulfonate,
2-oxo-2-phenylethylthiacyclopentanium 2-cyclohexanecarbonyl-oxy-1,1,3,3,3-pentafluoropropanesulfonate,
triphenylsulfonium perfluoro(1,3-propylenebissulfonyl)imide,
triphenylsulfonium bis(pentafluoroethylsulfonyl)imide,
2-(2,2,3,3,4,4,5,5-octafluoro-1-(nonafluorobutylsulfonyloxy-imino)pentyl)fluorene,
2-(2,2,3,3,4,4-pentafluoro-1-(nonafluorobutylsulfonyloxy-imino)butyl)fluorene,
2-(2,2,3,3,4,4,5,5,6,6-decafluoro-1-(nonafluorobutylsulfonyl-oxyimino)hexyl)fluorene,
2-(2,2,3,3,4,4,5,5-octafluoro-1-(2-(cyclohexanecarbony-loxy)-1,1,3,3,3-pentafluoropropanesulfonyloxyimino)pentyl)fluorene,
2-(2,2,3,3,4,4-pentafluoro-1-(2-(cyclohexanecarbonyloxy)-1,1,3,3,3-pentafluoropropanesulfonyloxyimino)butyl)fluorene,
and 2-(2,2,3,3,4,4,5,5,6,6-decafluoro-1-(nonafluorobutyl-sulfonyloxyimino)hexyl)fluorene.

When the photoacid generator (B) is added to the ArF immersion lithography resist composition, preference is given to sulfonium salts and oxime-O-sulfonates. Illustrative preferred photoacid generators include
triphenylsulfonium nonafluorobutanesulfonate,
triphenylsulfonium tridecafluorohexanesulfonate,
triphenylsulfonium heptadecafluorooctanesulfonate,
triphenylsulfonium perfluoro(4-ethylcyclohexane)sulfonate,
4-methylphenyldiphenylsulfonium nonafluorobutanesulfonate,
2-oxo-2-phenylethylthiacyclopentanium nonafluorobutanesulfonate,
4-tert-butylphenyldiphenylsulfonium nonafluorobutanesulfonate,
4-tert-butylphenyldiphenylsulfonium perfluoro(4-ethylcyclo-hexane)sulfonate,
4-tert-butylphenyldiphenylsulfonium heptafluorooctane-sulfonate,
triphenylsulfonium 1,1-difluoro-2-naphthylethanesulfonate,
triphenylsulfonium 1,1,2,2-tetrafluoro-2-(norbornan-2-yl)-ethanesulfonate,
triphenylsulfonium 2-benzoyloxy-1,1,3,3,3-pentafluoropropane-sulfonate,
triphenylsulfonium 1,1,3,3,3-pentafluoro-2-(pivaloyloxy)-propanesulfonate,
triphenylsulfonium 2-(cyclohexanecarbonyloxy)-1,1,3,3,3-pentafluoropropanesulfonate,
triphenylsulfonium 2-(2-naphthoyloxy)-1,1,3,3,3-pentafluoro-propanesulfonate, triphenylsulfonium 2-(1-adamantanecarbonyloxy)-1,1,3,3,3-pentafluoropropanesulfonate,
triphenylsulfonium 2-hydroxy-1,1,3,3,3-pentafluoropropane-sulfonate,
triphenylsulfonium adamantanemethoxycarbonyldifluoromethanesulfonate,
triphenylsulfonium 1-(3-hydroxymethyladamantane)methoxy-carbonyldifluoromethanesulfonate,
triphenylsulfonium methoxycarbonyldifluoromethanesulfonate,
4-tert-butylphenyldiphenylsulfonium 2-benzoyloxy-1,1,3,3,3-pentafluoropropanesulfonate,
4-tert-butylphenyldiphenylsulfonium 1,1,3,3,3-pentafluoro-2-(pivaloyloxy)propanesulfonate,
4-tert-butylphenyldiphenylsulfonium 2-(cyclohexanecarbonyl-oxy)-1,1,3,3,3-pentafluoropropanesulfonate,
4-tert-butylphenyldiphenylsulfonium 2-(2-naphthoyloxy)-1,1,3,3,3-pentafluoropropanesulfonate,
4-tert-butylphenyldiphenylsulfonium 2-(1-adamantanecarbonyl-oxy)-1,1,3,3,3-pentafluoropropanesulfonate,
4-tert-butylphenyldiphenylsulfonium 2-hydroxy-1,1,3,3,3-pentafluoropropanesulfonate,
4-tert-butylphenyldiphenylsulfonium adamantanemethoxycarbonyldifluoromethanesulfonate,
4-tert-butylphenyldiphenylsulfonium 1-(3-hydroxymethyladamantane)methoxycarbonyldifluoromethanesulfonate,
4-tert-butylphenyldiphenylsulfonium methoxycarbonyldifluoromethanesulfonate,
2-oxo-2-phenylethylthiacyclopentanium 2-benzoyloxy-1,1,3,3,3-pentafluoropropanesulfonate,
2-oxo-2-phenylethylthiacyclopentanium 2-cyclohexanecarbonyl-oxy-1,1,3,3,3-pentafluoropropanesulfonate,
triphenylsulfonium perfluoro(1,3-propylenebissulfonyl)imide,
triphenylsulfonium bis(pentafluoroethylsulfonyl)imide,
2-(2,2,3,3,4,4,5,5-octafluoro-1-(nonafluorobutylsulfonyloxy-imino)pentyl)fluorene,
2-(2,2,3,3,4,4-pentafluoro-1-(nonafluorobutylsulfonyloxy-imino)butyl)fluorene,
2-(2,2,3,3,4,4,5,5,6,6-decafluoro-1-(nonafluorobutylsulfonyl-oxyimino)hexyl)fluorene,
2-(2,2,3,3,4,4,5,5-octafluoro-1-(2-(cyclohexanecarbonyloxy)-1,1,3,3,3-pentafluoropropanesulfonyloxyimino)pentyl)fluorene,
2-(2,2,3,3,4,4-pentafluoro-1-(2-(cyclohexanecarbonyloxy)-1,1,3,3,3-pentafluoropropanesulfonyloxyimino)butyl)fluorene,
and 2-(2,2,3,3,4,4,5,5,6,6-decafluoro-1-(nonafluorobutylsulfonyloxyimino)hexyl)fluorene.

In the chemically amplified resist composition, the photoacid generator (B) may be added in any desired amount as long as the objects of the invention are not compromised. An appropriate amount of the photoacid generator (B) is 0.1 to 30 parts, and more preferably 0.5 to 20 parts by weight per 100 parts by weight of the base resin in the composition. Less than 0.1 phr of the photoacid generator (B) may lead to poor sensitivity whereas more than 30 phr may lead to lower transparency and lower resolution and give rise to a problem of foreign matter upon development and resist film peeling. The photoacid generators may be used alone or in admixture of two or more. The transmittance of the resist film can be controlled by using an photoacid generator having a low transmittance at the exposure wavelength and adjusting the amount of the photoacid generator added.

It is noted that an acid diffusion controlling function may be provided when two or more photoacid generators are used in admixture provided that one photoacid generator is an onium salt capable of generating a weak acid. Specifically, in a system using a mixture of a photoacid generator capable of generating a strong acid (e.g., fluorinated sulfonic acid) and an onium salt capable of generating a weak acid (e.g., non-fluorinated sulfonic acid or carboxylic acid), if the strong acid generated from the photoacid generator upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from the strong acid to the weak acid as above can take place, but it never happens that the weak acid collides with the unreacted onium salt capable of generating a strong acid to induce a salt exchange. This is because of a likelihood of an onium cation forming an ion pair with a stronger acid anion.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996).

Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition of the invention, an appropriate amount of the acid amplifier compound is up to 10 parts, and especially up to 5 parts by weight per 100 parts by weight of the base resin. Excessive amounts of the acid amplifier compound make diffusion control difficult, leading to degradation of resolution and pattern profile.

Organic Solvent

The organic solvent (C) used herein may be any organic solvent in which the base resin, acid generator, and other components are soluble. Illustrative, non-limiting, examples of the organic solvent include ketones such as cyclopentanone, cyclohexanone, 4-methyl-2-pentanone and methyl amyl ketone; alcohols such as 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, and ethylene glycol monoethyl ether; ethers such as propylene glycol dimethyl ether and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and carbonates such as ethylene carbonate and propylene carbonate. These solvents may be used alone or in combinations of two or more thereof. Of the above organic solvents, it is recommended to use propylene glycol monomethyl ether, PGMEA, cyclohexanone, γ-butyrolactone, ethyl lactate, and mixtures thereof because the base resin and acid generator are most soluble therein.

Although the amount of the organic solvent used may be determined as appropriate depending on the desired film thickness or other factors, the preferred amount is 200 to 6,000 parts, especially 400 to 4,000 parts by weight per 100 parts by weight of the base resin.

Quencher

A quencher (D) may be optionally used in the resist composition of the invention. The term "quencher" as used herein has a meaning generally known in the art and refers to a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Also included are amine compounds of the following general formula (B)-1.

$$N(X)_n(Y)_{3-n} \quad \text{(B)-1}$$

In the formula, n is equal to 1, 2 or 3. The side chain X is independently selected from groups of the following general formulas (X)-1 to (X)-3. The side chain Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

(X)-1

(X)-2

(X)-3

In the formulas, $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{50}$ alkyl groups in which some or all hydrogen atoms may be substituted by fluorine atoms and which may contain one or more hydroxyl, ether, ester groups or lactone rings; $R^{303}$ is a single bond or a straight or branched $C_1$-$C_4$ alkylene group; $R^{306}$ is a straight, branched or cyclic $C_1$-$C_{50}$ alkyl group in which some or all hydrogen atoms may be substituted by fluorine atoms and which may contain one or more hydroxyl, ether, ester groups or lactone rings.

Also useful are cyclic structure-bearing amine compounds having the following general formula (B)-2.

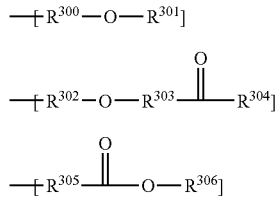
(B)-2

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Also included are cyano-bearing amine compounds having the following general formulae (B)-3 to (B)-6.

(B)-3

(B)-4

(B)-5

(B)-6

Herein X, $R^{307}$ and n are as defined in formula (B)-1, and $R^{308}$ and $R^{309}$ are each independently a straight or branched $C_1$-$C_4$ alkylene group.

Also included are amine compounds of imidazole structure having a polar functional group, represented by the general formula (B)-7.

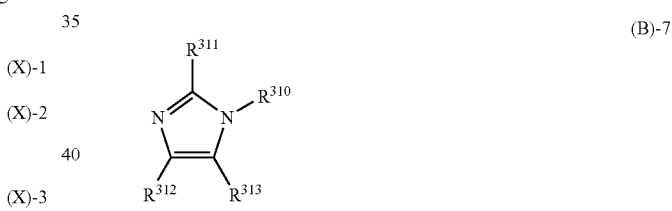
(B)-7

Herein $R^{310}$ is a straight, branched or cyclic $C_2$-$C_{50}$ alkyl group in which some or all hydrogen atoms may be substituted by fluorine atoms and which has one or more polar functional groups. The polar functional group is selected from among ester, acetal, cyano, hydroxyl, carbonyl, ether, sulfide, and carbonate groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Further included are amine compounds of benzimidazole structure having a polar functional group, represented by the general formula (B)-8.

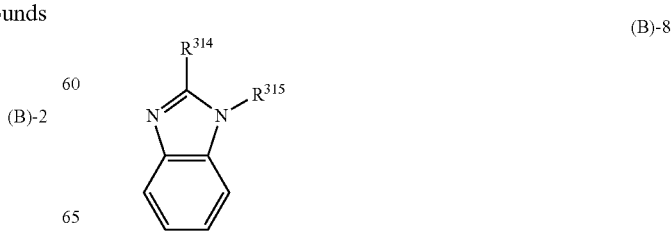
(B)-8

Herein $R^{314}$ is hydrogen, a straight, branched or cyclic $C_1$-$C_{50}$ alkyl group, aryl group or aralkyl group. $R^{315}$ is a straight, branched or cyclic $C_1$-$C_{50}$ alkyl group in which some or all hydrogen atoms may be substituted by fluorine atoms and which may have one or more polar functional groups selected from ester, acetal, cyano, hydroxyl, carbonyl, ether, sulfide, and carbonate groups and mixtures thereof.

Further included are heterocyclic nitrogen-containing compounds having a polar functional group, represented by the general formulae (B)-9 and (B)-10.

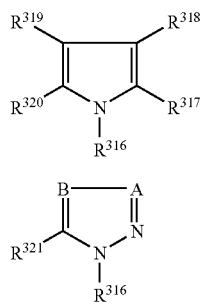

(B)-9

(B)-10

Herein A is a nitrogen atom or $=C-R^{322}$. B is a nitrogen atom or $=C-R^{323}$. $R^{316}$ is a straight, branched or cyclic $C_2$-$C_{50}$ alkyl group in which some or all hydrogen atoms may be substituted by fluorine atoms and which has one or more polar functional groups, the polar functional group being selected from among ester, acetal, cyano, hydroxyl, carbonyl, ether, sulfide, and carbonate groups and mixtures thereof. $R^{317}$, $R^{318}$, $R^{319}$ and $R^{320}$ are each independently hydrogen, a straight, branched or cyclic $C_1$-$C_{10}$, alkyl group or aryl group, or a pair of $R^{317}$ and $R^{318}$ and a pair of $R^{319}$ and $R^{320}$, taken together, may form a benzene, naphthalene or pyridine ring with the carbon atoms to which they are attached. $R^{321}$ is hydrogen, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group, or a pair of $R^{321}$ and $R^{323}$, taken together, may form a benzene or naphthalene ring with the carbon atoms to which they are attached.

Also included are organic nitrogen-containing compounds having an aromatic carboxylic acid ester structure, represented by the general formulae (B)-11 to (B)-14.

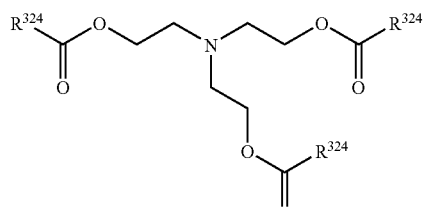

(B)-11

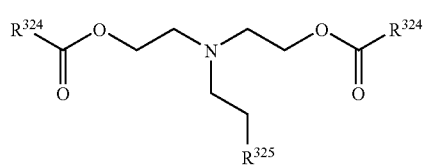

(B)-12

-continued

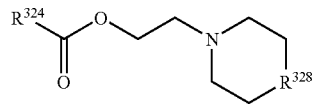

(B)-13

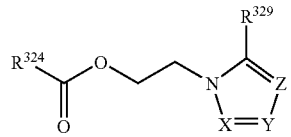

(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are amine compounds of 7-oxanorbornane-2-carboxylic ester structure, represented by the general formula (B)-15.

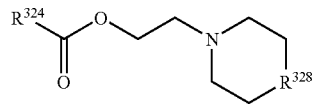

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

Illustrative examples of the quencher used herein are given below, but not limited thereto.

Examples of suitable primary aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). A typical nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexylamine, N-tert-butoxycarbonylbenzimidazole, and oxazolidinone.

Suitable ammonium salts include
pyridinium p-toluenesulfonate,
triethylammonium p-toluenesulfonate,
trioctylammonium p-toluenesulfonate,
triethylammonium 2,4,6-triisopropylbenzenesulfonate,
trioctylammonium 2,4,6-triisopropylbenzenesulfonate,
triethylammonium camphorsulfonate,
trioctylammonium camphorsulfonate,
tetramethylammonium hydroxide, tetraethylammonium hydroxide,
tetrabutylammonium hydroxide,
benzyltrimethylammonium hydroxide,
tetramethylammonium p-toluenesulfonate,
tetrabutylammonium p-toluenesulfonate,
benzyltrimethylammonium p-toluenesulfonate,
tetramethylammonium camphorsulfonate,
tetrabutylammonium camphorsulfonate,
benzyltrimethylammonium camphorsulfonate,
tetramethylammonium 2,4,6-triisopropylbenzenesulfonate,
tetrabutylammonium 2,4,6-triisopropylbenzenesulfonate,
benzyltrimethylammonium 2,4,6-triisopropylbenzenesulfonate,
tetramethylammonium acetate, tetrabutylammonium acetate,
benzyltrimethylammonium acetate, tetramethylammonium benzoate,
tetrabutylammonium benzoate, and
benzyltrimethylammonium benzoate.

Further examples of the tertiary amines include
tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine, tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
tris(2-benzoyloxyethyl)amine,
tris[2-(4-methoxybenzoyloxy)ethyl]amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Illustrative examples of the amine compounds include
1-[2-(methoxymethoxy)ethyl]pyrrolidine,
1-[2-(methoxymethoxy)ethyl]piperidine,
4-[2-(methoxymethoxy)ethyl]morpholine,
1-[2-(methoxymethoxy)ethyl]imidazole,
1-[2-(methoxymethoxy)ethyl]benzimidazole,
1-[2-(methoxymethoxy)ethyl]-2-phenylbenzimidazole,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
1-[2-[(2-methoxyethoxy)methoxy]ethyl]imidazole,
1-[2-[(2-methoxyethoxy)methoxy]ethyl]benzimidazole,
1-[2-[(2-methoxyethoxy)methoxy]ethyl]-2-phenylbenzimidazole,
1-[2-[2-(2-methoxyethoxy)ethoxy]ethyl]pyrrolidine,
1-[2-[2-(2-methoxyethoxy)ethoxy]ethyl]piperidine,
4-[2-[2-(2-methoxyethoxy)ethoxy]ethyl]morpholine,
1-[2-[2-(2-methoxyethoxy)ethoxy]ethyl]imidazole,
1-[2-[2-(2-methoxyethoxy)ethoxy]ethyl]benzimidazole,
1-[2-[2-(2-methoxyethoxy)ethoxy]ethyl]-2-phenylbenzimidazole,
1-[2-[2-(2-butoxyethoxy)ethoxy]ethyl]pyrrolidine,
1-[2-[2-(2-butoxyethoxy)ethoxy]ethyl]piperidine,
4-[2-[2-(2-butoxyethoxy)ethoxy]ethyl]morpholine,
1-[2-[2-(2-butoxyethoxy)ethoxy]ethyl]imidazole,
1-[2-[2-(2-butoxyethoxy)ethoxy]ethyl]benzimidazole,
1-[2-[2-(2-butoxyethoxy)ethoxy]ethyl]-2-phenylbenzimidazole,
1-[2-[2-[2-(2-methoxyethoxy)ethoxy]ethoxy]ethyl]pyrrolidine,
1-[2-[2-[2-(2-methoxyethoxy)ethoxy]ethoxy]ethyl]piperidine,
4-[2-[2-[2-(2-methoxyethoxy)ethoxy]ethoxy]ethyl]morpholine,
1-[2-[2-[2-(2-methoxyethoxy)ethoxy]ethoxy]ethyl]imidazole,
1-[2-[2-[2-(2-methoxyethoxy)ethoxy]ethoxy]ethyl]benzimidazole,
1-[2-[2-[2-(2-methoxyethoxy)ethoxy]ethoxy]ethyl]-2-phenyl-benzimidazole,
4-[2-{2-[2-(2-butoxyethoxy)ethoxy]ethoxy}ethyl]morpholine,
2-(1-pyrrolidinyl)ethyl acetate, 2-piperidinoethyl acetate,
2-morpholinoethyl acetate, 2-(1-imidazolyl)ethyl acetate,
2-(1-benzimidazolyl)ethyl acetate,
2-(2-phenyl-1-benzimidazolyl)ethyl acetate,
2-methoxyethyl morpholinoacetate,
2-(1-pyrrolidinyl)ethyl 2-methoxyacetate,
2-piperidinoethyl 2-methoxyacetate,
2-morpholinoethyl 2-methoxyacetate,
2-(1-imidazolyl)ethyl 2-methoxyacetate,
2-(1-benzimidazolyl)ethyl 2-methoxyacetate,
2-(2-phenyl-1-benzimidazolyl)ethyl 2-methoxyacetate,
2-(1-pyrrolidinyl)ethyl 2-(2-methoxyethoxy)acetate,
2-piperidinoethyl 2-(2-methoxyethoxy)acetate,
2-morpholinoethyl 2-(2-methoxyethoxy)acetate,
2-(1-imidazolyl)ethyl 2-(2-methoxyethoxy)acetate,
2-(1-benzimidazolyl)ethyl 2-(2-methoxyethoxy)acetate,
2-(2-phenyl-1-benzimidazolyl)ethyl 2-(2-methoxyethoxy)acetate,
2-(1-pyrrolidinyl)ethyl 2-[2-(2-methoxyethoxy)ethoxy]acetate,
2-piperidinoethyl 2-[2-(2-methoxyethoxy)ethoxy]acetate,
2-morpholinoethyl 2-[2-(2-methoxyethoxy)ethoxy]acetate,
2-(1-imidazolyl)ethyl 2-[2-(2-methoxyethoxy)ethoxy]acetate, 2-(1-benzimidazolyl)ethyl 2-[2-(2-methoxyethoxy)ethoxy]acetate,
2-(2-phenyl-1-benzimidazolyl)ethyl 2-[2-(2-methoxyethoxy)-ethoxy]acetate,
2-morpholinoethyl butyrate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-acetyl)cholate, 2-morpholinoethyl tris(O-formyl)cholate, 2-morpholinoethyl dehydrocholate,
2-morpholinoethyl cyclopentanecarboxylate,
2-morpholinoethyl cyclohexanecarboxylate,
2-(1-pyrrolidinyl)ethyl 7-oxanorbornane-2-carboxylate,
2-piperidinoethyl 7-oxanorbornane-2-carboxylate,
2-morpholinoethyl 7-oxanorbornane-2-carboxylate,
2-(1-imidazolyl)ethyl 7-oxanorbornane-2-carboxylate,
2-(1-benzimidazolyl)ethyl 7-oxanorbornane-2-carboxylate,
2-(2-phenyl-1-benzimidazolyl)ethyl 7-oxanorbornane-2-carboxylate,
2-morpholinoethyl adamantanecarboxylate,
2-(1-pyrrolidinyl)ethyl formate, 2-piperidinoethyl propionate,
2-morpholinoethyl acetoxyacetate,
2-(1-pyrrolidinyl)ethyl methoxyacetate,
2-(1-pyrrolidinyl)ethyl benzoate, 2-piperidinoethyl benzoate,
2-morpholinoethyl benzoate, 2-(1-imidazolyl)ethyl benzoate,
2-(1-benzimidazolyl)ethyl benzoate,
2-(2-phenyl-1-benzimidazolyl)ethyl benzoate,
2-(1-pyrrolidinyl)ethyl 4-methoxybenzoate,
2-piperidinoethyl 4-methoxybenzoate,
2-morpholinoethyl 4-methoxybenzoate,
2-(1-imidazolyl)ethyl 4-methoxybenzoate,
2-(1-benzimidazolyl)ethyl 4-methoxybenzoate,
2-(2-phenyl-1-benzimidazolyl)ethyl 4-methoxybenzoate,
2-(1-pyrrolidinyl)ethyl 4-phenylbenzoate,
2-piperidinoethyl 4-phenylbenzoate,
2-morpholinoethyl 4-phenylbenzoate,
2-(1-imidazolyl)ethyl 4-phenylbenzoate,
2-(1-benzimidazolyl)ethyl 4-phenylbenzoate,
2-(2-phenyl-1-benzimidazolyl)ethyl 4-phenylbenzoate,
2-(1-pyrrolidinyl)ethyl 1-naphthalenecarboxylate,
2-piperidinoethyl 1-naphthalenecarboxylate,
2-morpholinoethyl 1-naphthalenecarboxylate,
2-(1-imidazolyl)ethyl 1-naphthalenecarboxylate,
2-(1-benzimidazolyl)ethyl 1-naphthalenecarboxylate,
2-(2-phenyl-1-benzimidazolyl)ethyl 1-naphthalenecarboxylate,
2-(1-pyrrolidinyl)ethyl 2-naphthalenecarboxylate,
2-piperidinoethyl 2-naphthalenecarboxylate,
2-morpholinoethyl 2-naphthalenecarboxylate,
2-(1-imidazolyl)ethyl 2-naphthalenecarboxylate,
2-(1-benzimidazolyl)ethyl 2-naphthalenecarboxylate,
2-(2-phenyl-1-benzimidazolyl)ethyl 2-naphthalenecarboxylate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, etc.

Illustrative examples of the cyano-bearing amine compounds include 3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile, N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The quenchers may be used alone or in admixture of two or more. The quencher is preferably formulated in an amount of 0.001 to 5 parts, and especially 0.01 to 3 parts by weight, per 100 parts by weight of the base resin. Less than 0.001 phr of the quencher may achieve no addition effect whereas more than 5 phr may lead to too low a sensitivity.

Surfactant

Optionally, the resist composition of the invention may further comprise a surfactant which is commonly used for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08 and R30 (Dai-Nippon Ink & Chemicals, Inc.), Fluorad FC-430, FC-431, FC-4430 and FC-4432 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430, Surflon S-381, Surfynol E1004, KH-20 and KH-30 are preferred. They may be used alone or in admixture.

In the chemically amplified resist composition, the surfactant is preferably formulated in an amount of up to 2 parts, and especially up to 1 part by weight, per 100 parts by weight of the base resin.

In one embodiment wherein the immersion lithography is applied to the resist composition of the invention, particularly in the absence of a resist protective film, the resist composition may have added thereto another surfactant having a propensity to segregate at the resist surface after spin coating for achieving a function of minimizing water penetration or leaching. The preferred other surfactant is a polymeric surfactant which is insoluble in water, but soluble in alkaline developer, and especially which is water repellent and enhances water slippage.

Suitable polymeric surfactants are shown below, but not limited thereto.

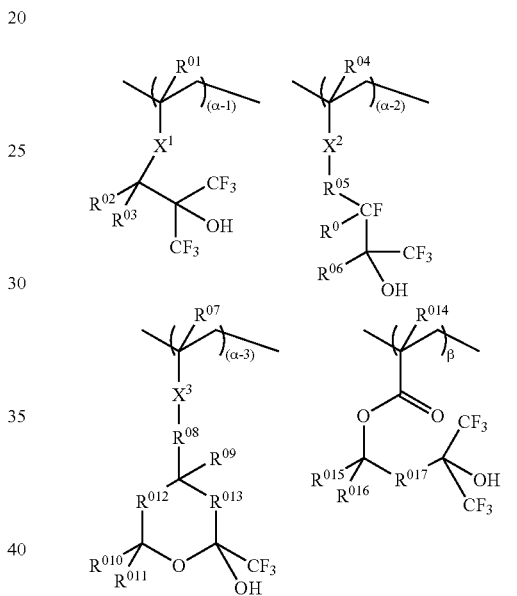

Herein $R^{01}$, $R^{04}$, $R^{07}$ and $R^{014}$ are each independently hydrogen or methyl, $R^{02}$, $R^{03}$, $R^{015}$ and $R^{016}$ are each independently hydrogen, or straight, branched or cyclic $C_1$-$C_{20}$ alkyl or fluoroalkyl, $R^{02}$ and $R^{03}$ or $R^{015}$ and $R^{016}$ may bond together to form a non-aromatic ring with the carbon atom to which they are attached, and in the ring-forming case, $R^{02}$ and $R^{03}$, or $R^{015}$ and $R^{016}$ denote straight, branched or cyclic alkylene or fluoroalkylene groups having 2 to 20 carbon atoms in total, $R^0$ is fluorine or hydrogen or may bond with $R^{05}$ to form a non-aromatic ring having 3 to 10 carbon atoms in total with the carbon atom to which they are attached, $R^{05}$ is straight, branched or cyclic $C_1$-$C_6$ alkylene in which one or more hydrogen atoms may be substituted by fluorine, $R^{06}$ is straight or branched $C_1$-$C_{10}$ alkyl in which one or more hydrogen atoms are substituted by fluorine, $R^{05}$ and $R^{06}$ may bond together to form a non-aromatic ring with the carbon atoms to which they are attached, and in the ring-forming case, $R^{05}$ and $R^{06}$ denote trivalent organic groups having 2 to 12 carbon atoms in total, $R^{08}$ is a single bond or $C_1$-$C_4$ alkylene, $R^{010}$ and $R^{011}$ are each independently hydrogen, fluorine, methyl or trifluoromethyl, $R^{012}$ and $R^{013}$ are each independently a single bond, —O— or —$CR^{018}R^{019}$—, $R^{09}$, $R^{018}$ and $R^{019}$ are hydrogen, fluorine, methyl or trifluoromethyl, $R^{017}$ is straight or branched $C_1$-$C_4$ alkylene, or may bond with $R^{015}$ and $R^{016}$ to form a non-aromatic ring with the carbon atom to which they are attached, $X^1$, $X^2$ and $X^3$ are each independently —C(=O)—O—, —O— or —C(=O)—$R^{020}$—C(=O)—O— wherein $R^{020}$ is straight, branched or cyclic $C_1$-$C_{10}$ alkylene, α-1, α-2, α-3 and β are numbers in the range: $0 \leq (\alpha\text{-}1) < 1$, $0 \leq (\alpha\text{-}2) < 1$, $0 \leq (\alpha\text{-}3) < 1$, $0 < (\alpha\text{-}1)+(\alpha\text{-}2)+(\alpha\text{-}3) < 1$, $0 < \beta < 1$, and $0 < (\alpha\text{-}1)+(\alpha\text{-}2)+(\alpha\text{-}3)+\beta \leq 1$.

To the resist composition, the polymeric surfactant is added in an amount of 0.001 to 20 parts, preferably 0.01 to 10 parts by weight, per 100 parts by weight of the base polymer.

While the resist composition of the invention typically comprises the hydrogenate ROMP polymer or base resin, acid generator, organic solvent, quencher and surfactant as described above, there may be added optional other ingredients such as dissolution inhibitors, acidic compounds, stabilizers, and dyes. Optional ingredients may be added in conventional amounts so long as this does not compromise the objects of the invention.

Other Polymer

To the resist composition of the invention, another polymer other than the inventive hydrogenated ROMP polymer may also be added. The other polymers that can be added to the resist composition are, for example, those polymers comprising units of the following formula (R1) and/or (R2) and having a weight average molecular weight of 1,000 to 500,000, especially 3,000 to 100,000 although the other polymers are not limited thereto.

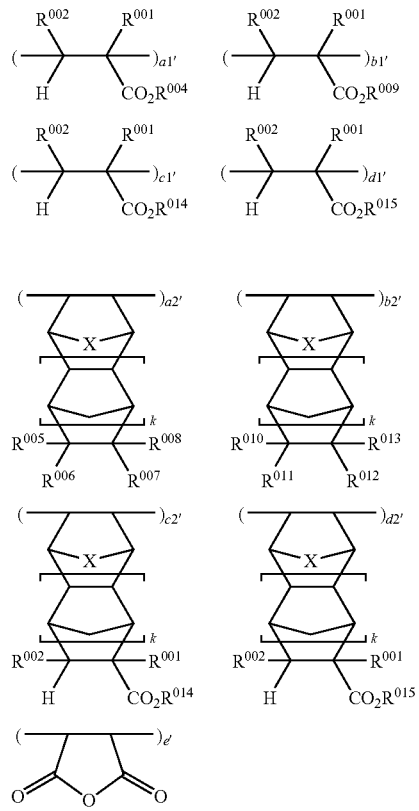

(R1)

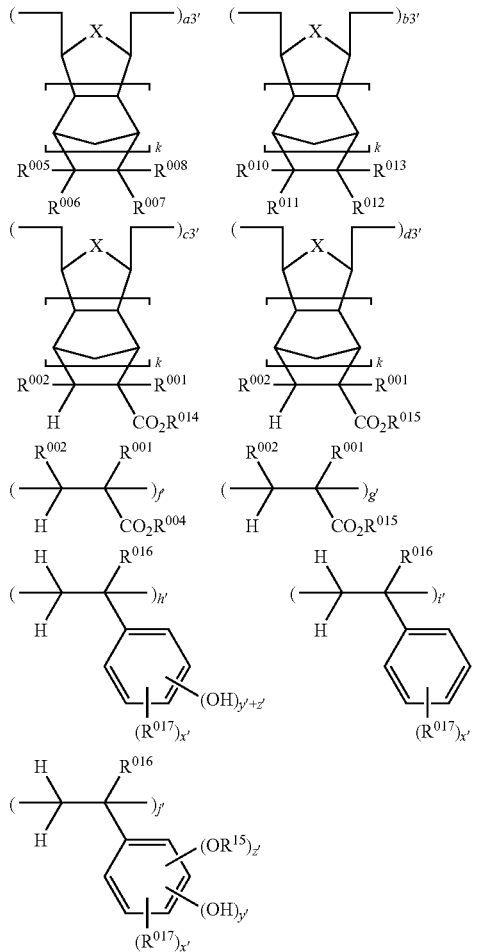

(R2)

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group. $R^{004}$ is hydrogen or a monovalent $C_1$-$C_{15}$ hydrocarbon group having a carboxyl or hydroxyl group. At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Alternatively, a combination of $R^{005}$ to $R^{008}$ (e.g., a pair of $R^{005}$ and $R^{006}$, or $R^{006}$ and $R^{007}$) may bond together to form a ring with the carbon atom to which they are attached, and in that event, at least one of ring-forming $R^{005}$ to $R^{008}$ is a divalent $C_1$-$C_{15}$ hydrocarbon group having a carboxyl or hydroxyl group, while the remaining R's are independently single bonds or straight, branched or cyclic $C_1$-$C_{15}$ alkylene groups. $R^{009}$ is a monovalent $C_3$-$C_{15}$ hydrocarbon group containing a —$CO_2$— partial structure. At least one of $R^{010}$ to $R^{013}$ is a monovalent $C_1$-$C_{15}$ hydrocarbon group containing a —$CO_2$— partial structure, while the remaining R's are independently hydrogen or straight, branched or cyclic $C_1$-$C_{15}$ alkyl groups. A combination of $R^{010}$ to $R^{013}$ (e.g., $R^{010}$ and $R^{011}$, or $R^{011}$ and $R^{012}$) may bond together to form a ring with the carbon atom to which they are attached, and in that event, at least one of ring-forming $R^{010}$ to $R^{013}$ is a divalent $C_1$-$C_{15}$ hydrocarbon group containing a —$CO_2$— partial structure, while the remaining R's are independently single bonds or straight, branched or cyclic $C_1$-$C_{15}$ alkylene groups. $R^{014}$ is a polycyclic $C_1$-$C_{15}$ hydrocarbon group or an alkyl group containing a polycyclic hydrocarbon group. $R^{015}$ is an acid labile group. $R^{016}$ is hydrogen or methyl. $R^{017}$ is a straight, branched or cyclic $C_1$-$C_8$ alkyl group. X is $CH_2$ or an oxygen atom. Letter k' is 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1.

The inventive polymer (hydrogenated ROMP polymer) and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Process

Pattern formation using the resist composition of the invention may be performed by well-known lithography processes. The process generally involves coating, heat treatment (or prebaking), exposure, heat treatment (post-exposure baking, PEB), and development. If necessary, any additional steps may be added.

For pattern formation, the resist composition is first applied onto a substrate (on which an integrated circuit is to be formed, e.g., Si, $SiO_2$, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 50 to 150° C. for 1 to 10 minutes, preferably 60 to 140° C. for 1 to 5 minutes. The resulting resist film is generally 0.01 to 2.0 µm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, reactant gases such as butane, ethane, propane, ethylene and acetylene are used. For the silicon-containing intermediate layer, either a coating method or a CVD method may be employed. The coating method uses silsesquioxane, polyhedral oligomeric silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing (or post-soaking) may be carried out for extracting the photoacid generator and the like from the film surface or washing away particles, or a protective film may be coated.

With a mask having a desired pattern placed above the resist film, the resist film is then exposed to radiation such as UV, deep-UV, electron beam, x-ray, excimer laser light, γ-ray and synchrotron radiation. The exposure dose is preferably about 1 to 200 $mJ/cm^2$, more preferably about 10 to 100 $mJ/cm^2$. The film is further baked on a hot plate at 60 to 150° C. for 1 to 5 minutes, preferably at 80 to 120° C. for 1 to 3 minutes (post-exposure baking=PEB). Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate. It is appreciated that the resist composition of the invention is suited for nano-scale patterning using such high-energy radiation as deep UV with a wavelength of 254 to 193 nm, vacuum UV with a wavelength of 157 nm, electron beam, soft x-ray, x-ray, excimer laser light, γ-ray and synchrotron radiation, and best suited for nano-scale patterning using high-energy radiation in the wavelength range of 180 to 200 nm.

Immersion lithography can be applied to the resist composition of the invention. The ArF immersion lithography uses a liquid having a refractive index of at least 1 and highly transparent at the exposure wavelength such as deionized water or alkanes as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer size patterns is possible. The immersion lithography is important for the ArF lithography to survive to the 45-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking, for preventing any leach-out from the resist and improving water slip on the film surface. The resist protective coating used in the immersion lithography is preferably formed from a solution of a polymer having 1,1,1,3,3,3-hexafluoro-2-propanol residue which is insoluble in water, but soluble in an alkaline developer liquid, in a solvent selected from alcohols of at least 4 carbon atoms, ethers of 8 to 12 carbon atoms, and mixtures thereof.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material. The resist composition of the invention is applicable to immersion lithography using a high refractive index liquid.

The process that now draws attention as the technology for extending the life of the ArF lithography is a double patterning process involving a first set of exposure and development to form a first pattern and a second set of exposure and development to form a second pattern between features of the first pattern. See Proc. SPIE, Vol. 5754, p 1508 (2005). A number of double patterning processes have been proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings. One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. However, these methods using negative resist materials with low resolution entail degradation of resolution.

If first exposure is followed by second exposure at a half-pitch shifted position, the optical energy of second exposure offsets the optical energy of first exposure so that the contrast becomes zero. If a contrast enhancement layer (CEL) is formed on the resist film, the incident light to the resist film becomes nonlinear so that the first and second exposures do not offset each other. Thus an image having a half pitch is formed. See Jpn. J. Appl. Phy. Vol. 33 (1994) p 6874-6877. It is expected that similar effects are produced by using an acid generator capable of two photon absorption to provide a nonlinear contrast.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for insolubilizing the resist pattern with respect to the resist solvent and alkaline developer, applying a second resist thereon, and forming a second resist pattern in space portions of the first resist pattern. With this freezing technology, etching of the substrate is required only once, leading to improved throughputs and avoiding the problem of misregistration due to stress relaxation of the hard mask during etching. In the freezing technology, development efforts are focused on the step of forming a resist film on the first resist pattern and the optical or thermal step of insolubilizing the resist pattern. The resist composition of the invention is also applicable to such a process. Examples of light used for the freezing purpose include preferably light with a wavelength of up to 300 nm, more preferably up to 200 nm, specifically ArF excimer light of wavelength 193 nm, $Xe_2$ excimer light of 172 nm, $F_2$ excimer light of 157 nm, $Kr_2$ excimer light of 146 nm, and $Ar_2$ excimer light of 126 nm, and the exposure dose in the case of light is preferably in the range of 10 mJ/cm$^2$ to 10 J/cm$^2$. Irradiation from an excimer laser of sub-200 nm wavelength, especially 193 nm, 172 nm, 157 nm, 146 nm, and 122 nm, or an excimer lamp not only causes the photoacid generator to generate an acid, but also promotes photo-induced crosslinking reaction. In a further example where a thermal acid generator in the form of an ammonium salt is added to a photoresist composition, specifically in an amount of 0.001 to 20 parts, more specifically 0.01 to 10 parts by weight per 100 parts by weight of the base resin, an acid can be generated by heating. In this case, acid generation and crosslinking reaction proceed simultaneously. The preferred heating conditions include a temperature of 100 to 300° C., and especially 130 to 250° C., and a time of 10 to 300 seconds. As a result, a crosslinked resist film is formed which is insoluble in solvents and alkaline developers. The resist composition of the invention can be applied to the double patterning process discussed above.

The hydrogenated ROMP polymer of the invention is improved in light transmittance, dissolution in alkaline developer, and etching resistance and useful as a base resin in photoresist materials for the fabrication of microelectronic devices using UV or DUV. The resist composition comprising the polymer as a base resin lends itself to micropatterning with EB or DUV since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed. According to the method of the invention, any desired one of varying polymers within the scope of formula [1] can be simply synthesized in high yields by starting with a certain compound [2], and reacting it with an optimum one selected from a variety of alkylating agents, without a need for modifying the starting monomer. This enables to easily tailor the performance of resist material so as to meet the customer's demand. The invention is of great industrial worth.

EXAMPLE

Examples and Comparative Examples are given below by way of illustration and not by way of limitation.

Example 1

Synthesis of Polymer P-1

A mixture of 10.0 g of a polymer (P-0, Mw=8,860, Mw/Mn=1.93), 1.13 g of an alkylating agent (AA-1), 0.98 g of triethylamine, and 40.0 g of N,N-dimethylformamide was heated and stirred at 60° C. for 24 hours. The reaction mixture was cooled, and the excess of triethylamine was neutralized with hydrochloric acid. This was followed by standard aqueous work-up and concentration, obtaining a crude polymer. A solution of the crude polymer in tetrahydrofuran was added to ultrapure water whereupon the polymer precipitated. Subsequent filtration, water washing and vacuum drying yielded 10.5 g of Polymer P-1 (yield 96%). On GPC analysis, the polymer had a weight average molecular weight Mw of 9,040 and a dispersity Mw/Mn of 1.89. FIG. 1 shows a $^1$H-NMR spectrum (600 MHz, deuterated THF) of the polymer.

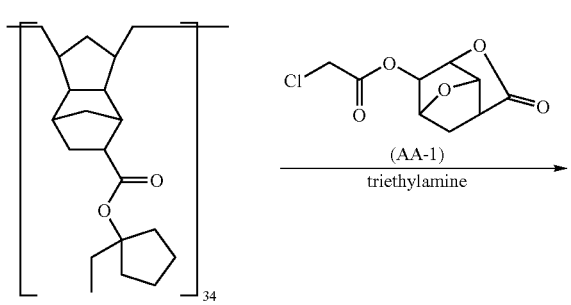

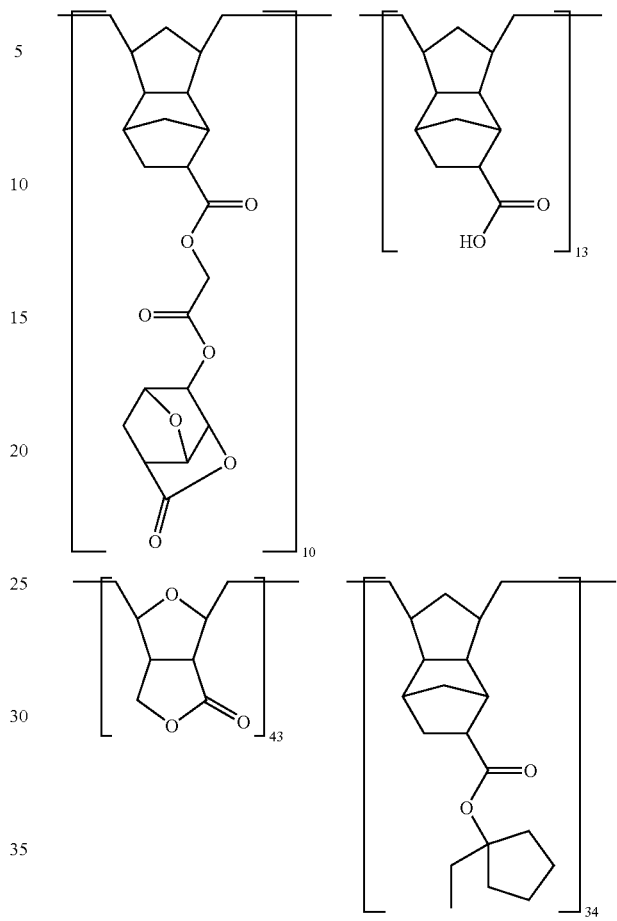

Examples 2 to 8

Synthesis of Polymers P-2 to P-8

Polymers P-2 to P-8 were synthesized by the same procedure as in Example 1 aside from using the starting polymer and alkylating agent shown in Table 1.

TABLE 1

| Example | Polymer | Yield, % | MW | Mn | Starting polymer | Alkylating agent |
|---|---|---|---|---|---|---|
| 2 | P-2 | 94 | 9,240 | 1.90 | SP-1 | AA-2 |
| 3 | P-3 | 97 | 9,240 | 1.90 | SP-1 | AA-3 |
| 4 | P-4 | 94 | 9,130 | 1.89 | SP-1 | AA-4 |
| 5 | P-5 | 99 | 9,000 | 1.89 | SP-2 | AA-1 |
| 6 | P-6 | 97 | 9,140 | 1.99 | SP-2 | AA-3 |
| 7 | P-7 | 92 | 9,550 | 2.03 | SP-3 | AA-5 |
| 8 | P-8 | 95 | 8,090 | 2.06 | SP-4 | AA-6 |

TABLE 1-continued
| Example | Polymer | Yield, % | MW | Mn | Starting polymer | Alkylating agent |
|---|---|---|---|---|---|---|
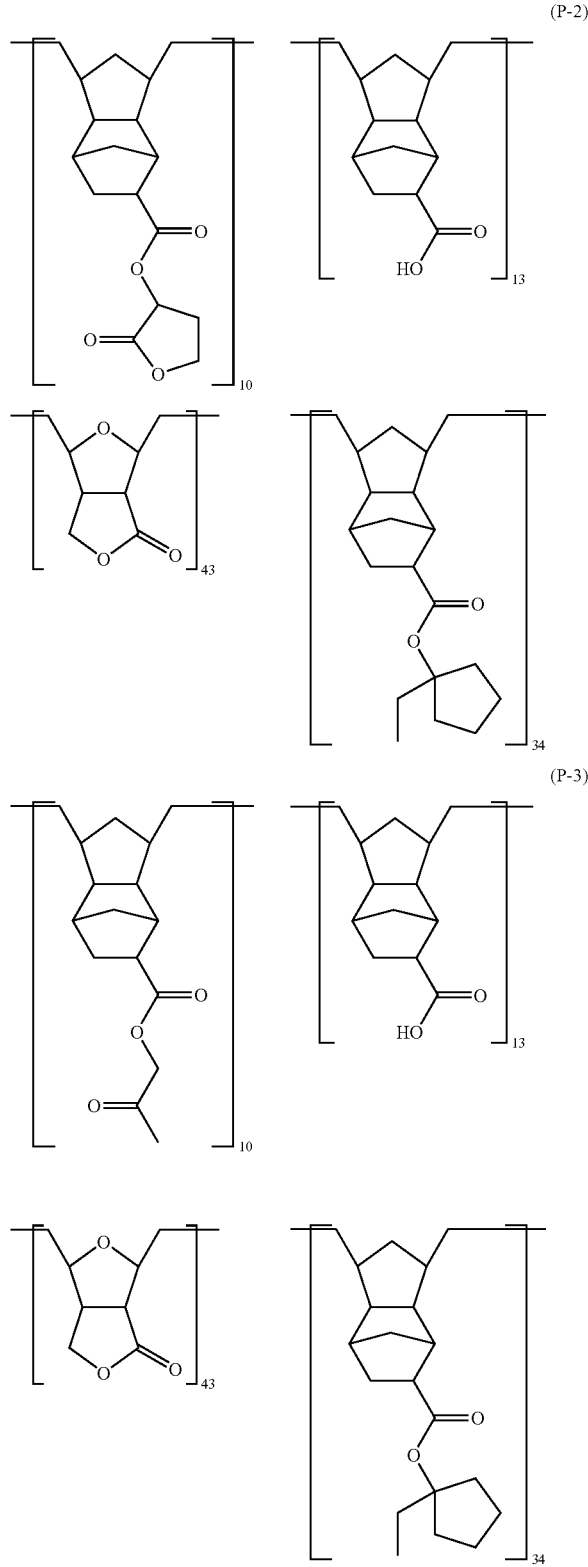
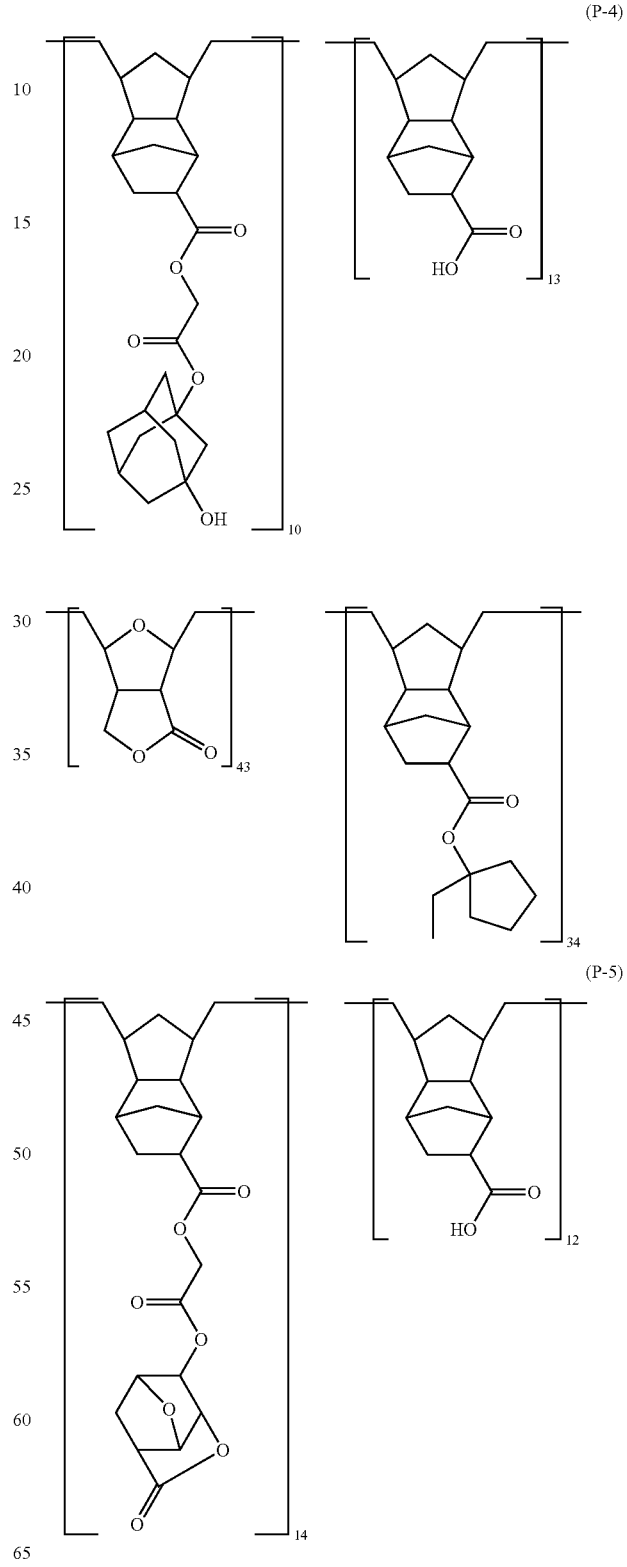

TABLE 1-continued

| Example | Polymer | Yield, % | MW | Mn | Starting polymer | Alkylating agent |
|---|---|---|---|---|---|---|

(structures only; no numerical data visible in this continuation)

Resist compositions were formulated using the inventive polymers as the base resin and examined for resist properties.

Examples I-1 to I-8 and Comparative Examples II-1 to II-3

Resist compositions were prepared by using inventive polymers (P-1 to P-8) or comparative polymers (CP-1 to CP-3, shown below) as the base resin, and dissolving the polymer, an acid generator and a basic compound in a solvent in accordance with the formulation shown in Tables 2 and 3. These compositions were each filtered through a Teflon® filter with a pore diameter of 0.2 μm, thereby giving resist solutions.

-continued

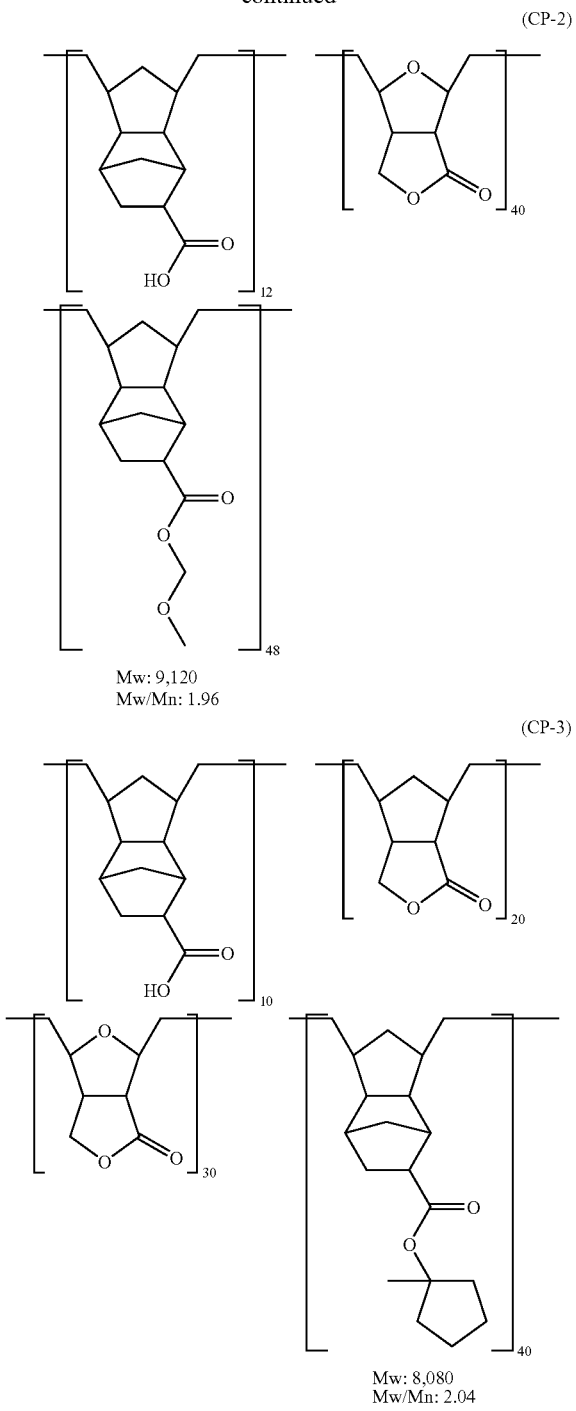

These resist solutions were spin-coated onto silicon wafers having an antireflective coating (ARC29A by Nissan Chemical Industries, Ltd.) of 78 nm thick coated thereon, then baked at 100° C. to 130° C. for 60 seconds to give resist films having a thickness of 250 nm. The resist films were exposed using an ArF excimer laser stepper (Nikon Corporation, NA 0.68), then baked (PEB) at 100° C. to 130° C. for 60 seconds, and puddle developed for 60 seconds with an aqueous solution of 2.38% tetramethylammonium hydroxide (TMAH), thereby forming 1:1 line-and-space patterns.

The wafer as developed was cut and the section observed under a scanning electron microscope (SEM). The optimum exposure (Eop, $mJ/cm^2$) is defined as the exposure dose which provides a 1:1 resolution at the top and bottom of a 130 nm line-and-space pattern. The resolution of a resist under test is defined as the minimum line width (nm) of a line-and-space pattern that remains separated at the optimum exposure, with smaller values indicating better resolution. Also the dependency on exposure dose of line width of a 130 nm line-and-space pattern was examined. Provided that a line width of 130 nm±10% (i.e., between 117 nm and 143 nm) was permissible, a ratio (%) of the exposure dose range providing the permissible line width to the optimum exposure dose is computed and reported as exposure latitude, with greater values indicating better. Patterns having lines of gradually narrowing width were formed by changing the exposure dose in increments, and the minimum line width above which the lines of 130 nm line-and-space pattern did not collapse was determined and reported as collapse margin, with smaller values being better. Furthermore, the lines of 130 nm line-and-space pattern were observed under SEM, and an RMS value of line roughness was computed and reported as line edge roughness (LER), with smaller values being better.

Table 2 shows the composition of resist materials in Examples, and their test results of resolution at optimum soft-baking (SB)/post-exposure baking (PEB) temperatures. Table 3 shows the composition and test results of resist materials in Comparative Examples. In Tables 2 and 3, the acid generator, quencher and solvent are as identified below. It is noted that the solvent contained 0.01 wt % of surfactant (Asahi Glass Co., Ltd.).

TPSNf: triphenylsulfonium nonafluorobutanesulfonate
Q1: tris(methoxymethoxyethyl)amine
CyHO: cyclohexanone

TABLE 2

| Example | Resin (pbw) | Acid generator (pbw) | Quencher (pbw) | Organic solvent (pbw) | SB/PEB temp. (° C.) | Eop (mJ/cm²) | Resolution (nm) | Exposure latitude (%) | Collapse margin (nm) | LER (nm) |
|---|---|---|---|---|---|---|---|---|---|---|
| I-1 | P-1 (80) | TPSNf (1) | Q1 (0.236) | CyHO (640) | 100/110 | 22.0 | 120 | 16 | 72 | 6.0 |
| I-2 | P-2 (80) | TPSNf (1) | Q1 (0.236) | CyHO (640) | 100/110 | 23.0 | 120 | 16 | 78 | 5.9 |

TABLE 2-continued

| Example | Resin (pbw) | Acid generator (pbw) | Quencher (pbw) | Organic solvent (pbw) | SB/PEB temp. (° C.) | Eop (mJ/cm$^2$) | Resolution (nm) | Exposure latitude (%) | Collapse margin (nm) | LER (nm) |
|---|---|---|---|---|---|---|---|---|---|---|
| I-3 | P-3 (80) | TPSNf (1) | Q1 (0.236) | CyHO (640) | 100/110 | 24.0 | 110 | 18 | 96 | 5.5 |
| I-4 | P-4 (80) | TPSNf (1) | Q1 (0.236) | CyHO (640) | 110/110 | 28.0 | 120 | 22 | 99 | 6.2 |
| I-5 | P-5 (80) | TPSNf (1) | Q1 (0.236) | CyHO (640) | 100/110 | 25.0 | 120 | 20 | 70 | 5.9 |
| I-6 | P-6 (80) | TPSNf (1) | Q1 (0.236) | CyHO (640) | 100/110 | 25.0 | 110 | 20 | 99 | 6.0 |
| I-7 | P-7 (80) | TPSNf (1) | Q1 (0.236) | CyHO (640) | 100/100 | 19.0 | 120 | 18 | 98 | 4.8 |
| I-8 | P-8 (80) | TPSNf (1) | Q1 (0.236) | CyHO (640) | 110/120 | 26.0 | 110 | 25 | 78 | 4.5 |

TABLE 3

| Comparative Example | Resin (pbw) | Acid generator (pbw) | Quencher (pbw) | Organic solvent (pbw) | SB/PEB temp. (° C.) | Eop (mJ/cm$^2$) | Resolution (nm) | Exposure latitude (%) | Collapse margin (nm) | LER (nm) |
|---|---|---|---|---|---|---|---|---|---|---|
| II-1 | CP-1 (80) | TPSNf (1) | TMMEA (0.236) | CyHO (640) | 100/110 | 26.0 | 120 | 10 | 102 | 6.5 |
| II-2 | CP-2 (80) | TPSNf (1) | TMMEA (0.236) | CyHO (640) | 100/115 | 22.0 | 120 | 16 | 99 | 6.3 |
| II-3 | CP-3 (80) | TPSNf (1) | TMMEA (0.236) | CyHO (640) | 110/120 | 23.0 | 120 | 14 | 104 | 5.9 |

It is evident from Tables 2 and 3 that any desired resist factor can be readily tailored by a choice of an optimum structure among polymers varying within the scope of the invention. When resist materials are subject to ArF excimer laser lithography, various factors including resolution, exposure latitude, collapse margin, and LER can be improved as desired.

Japanese Patent Application No. 2008-080605 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A polymer having a rate of dissolution in an alkaline developer that increases under the action of acid, represented by the general formula [1]:

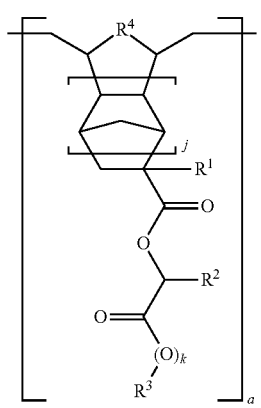

[A]

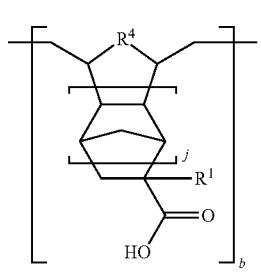

[B]

-continued

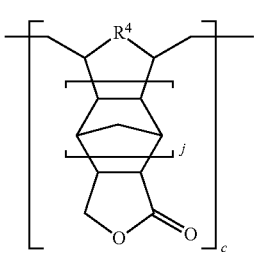
[C]

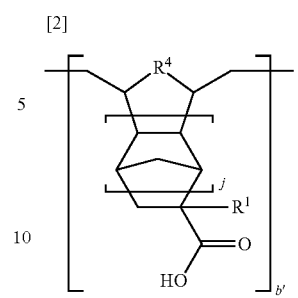
[2]

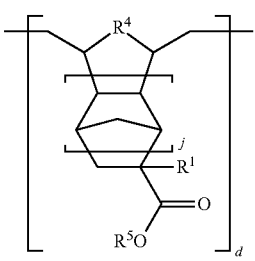
[D]

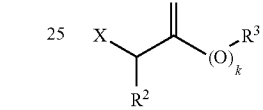
[3]

wherein a, b, c and d indicative of proportions of the respective recurring units relative to the overall number of recurring units are in the range: $0<a<1$, $0b\leq1$, $0\leq c<1$, $0\leq d<1$, and $a+b+c+d=1$;

j is each independently 0 or 1;

k is 0 or 1;

$R^1$ is each independently hydrogen or methyl;

$R^2$ is hydrogen or a single bond;

$R^3$ is a straight, branched and/or cyclic $C_1$-$C_{20}$ alkyl group which may have an oxygen functional group;

when $R^2$ is a single bond, $R^2$ bonds with $R^3$ wherein —$R^2$—$R^3$— is a straight, branched or cyclic $C_1$-$C_{20}$ alkylene group which may have an oxygen functional group;

$R^4$ is each independently methylene or oxygen; and $R^5$ is a $C_2$-$C_{20}$ acid labile group.

2. The polymer of claim 1 wherein in formula [1], the recurring units included at proportion "a" have a lactone structure.

3. The polymer of claim 1 wherein in formula [1], k=0.

4. The polymer of claim 1 wherein in formula [1], k=1 and $R^3$ is a straight, branched or cyclic $C_1$-$C_{20}$ alkyl group having a hydroxyl group.

5. The polymer of claim 1 wherein in formula [1], k=1 and $R^3$ is an acid labile group.

6. A method for preparing a polymer of formula [1] having a rate of dissolution in an alkaline developer that increases under the action of acid as set forth in claim 1, comprising reacting a hydrogenated ring-opening metathesis polymer having the general formula [2] with a compound having the general formula [3] in the presence of a base, wherein b', c and d indicative of proportions of the respective recurring units relative to the overall number of recurring units are in the range: $0<b'<1$, $0\leq c<1$, $0\leq d<1$, and $b'+c+d=1$;

j is each independently 0 or 1;

k is 0 or 1;

$R^1$ is each independently hydrogen or methy;

$R^2$ is hydrogen or a single bond;

$R^3$ is a straight, branched and/or cyclic $C_1$-$C_{20}$ alkyl group which may have an oxygen functional group;

when $R^2$ is a single bond, $R^2$ bonds with $R^3$ wherein —$R^2$—$R^3$— is a straight, branched or cyclic $C_1$-$C_{20}$ alkylene group which may have an oxygen functional group;

$R^4$ is each independently methylene or oxygen;

$R^5$ is a $C_2$-$C_{20}$ acid labile group; and

X is a leaving group.

7. The method of claim 6 wherein the oxygen functional group is selected from the group consisting of hydroxyl, ketone, ether, ester, lactone and acetal.

8. The method of claim 6 wherein the leaving group is selected from the group consisting of halogen, alkanesulfonyloxy and arenesulfonyloxy.

9. The method of claim 6, wherein the compound having the formula [3] is selected from the group consisting of compounds having the following formulae:

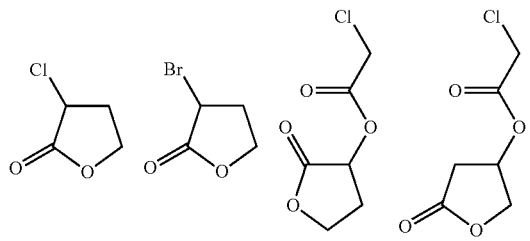

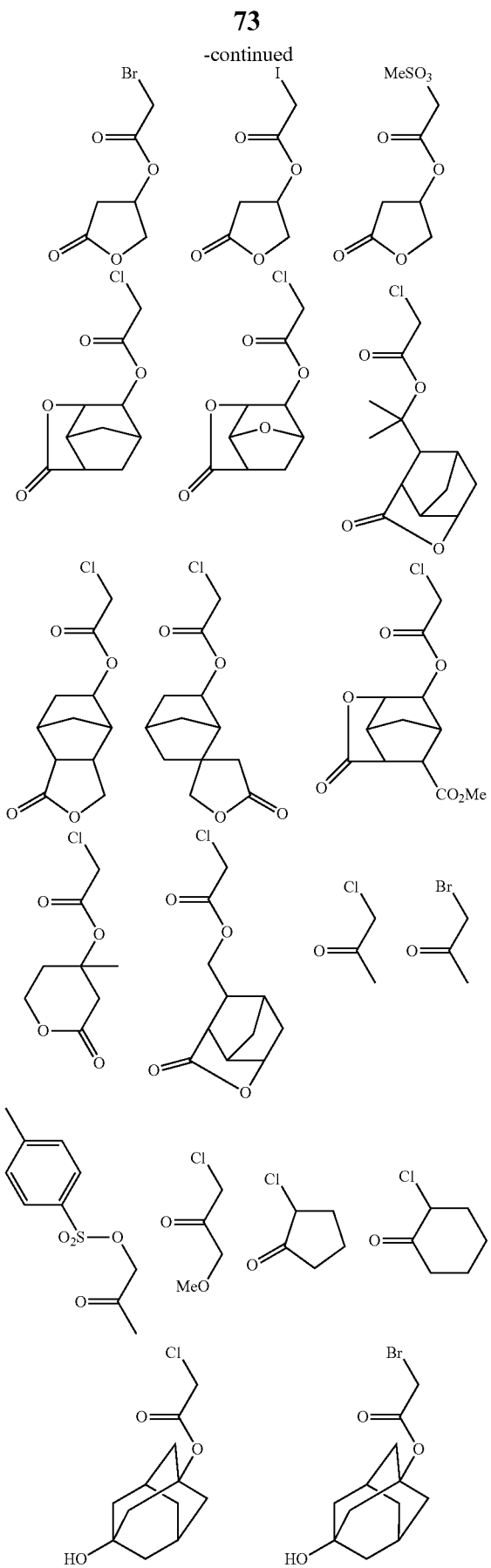
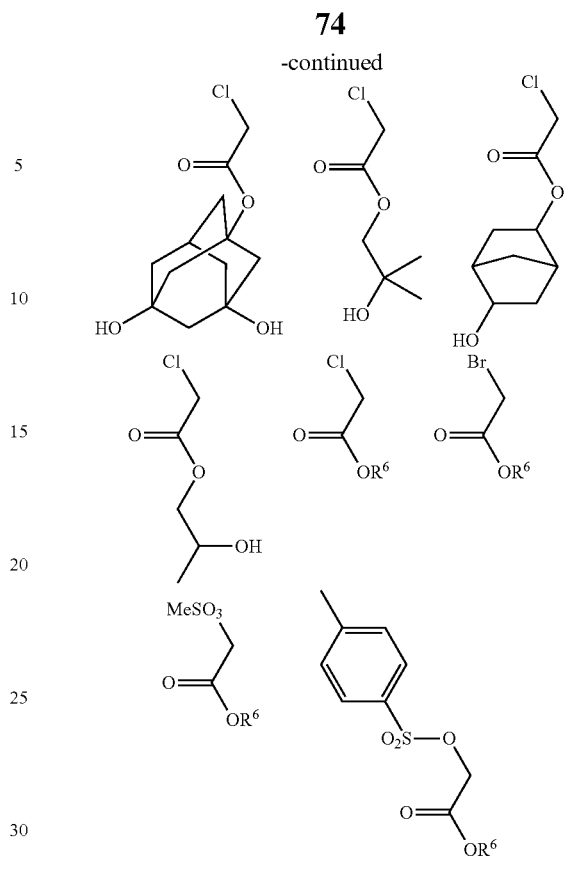

wherein R⁶ denotes an acid labile group.

10. A chemically amplified positive resist composition comprising the polymer of claim 1 as a base resin.

11. A chemically amplified positive resist composition comprising (A) the polymer of claim 1 as a base resin, (B) an acid generator, (C) an organic solvent, and optionally (D) a quencher and/or (E) a surfactant.

12. A process for forming a pattern, comprising the steps of (1) applying the resist composition of claim 10 or 11 onto a substrate, (2) heat treating and exposing to high-energy radiation having a wavelength up to 300 nm or electron beam through a photomask, (3) heat treating and developing with a developer.

13. The polymer of claim 1 wherein the oxygen functional group is selected from the group consisting of hydroxyl, ketone, ether, ester, lactone and acetal.

14. The polymer of claim 1, wherein the structural unit [A] is selected from the group consisting of the following formulae:

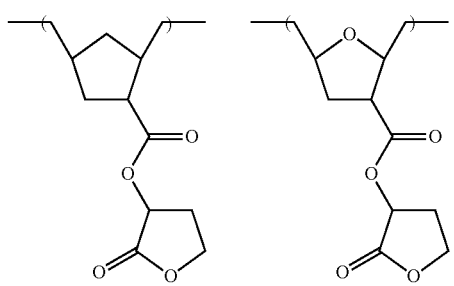

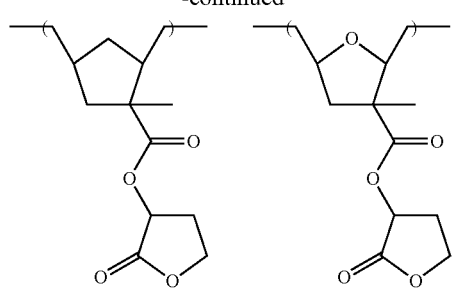
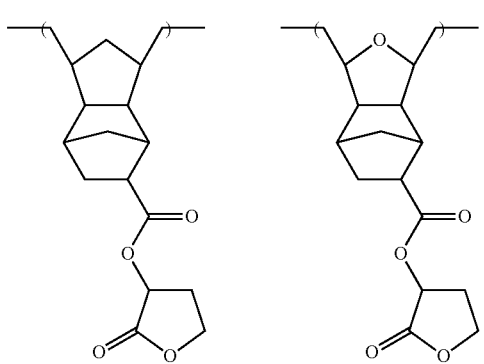
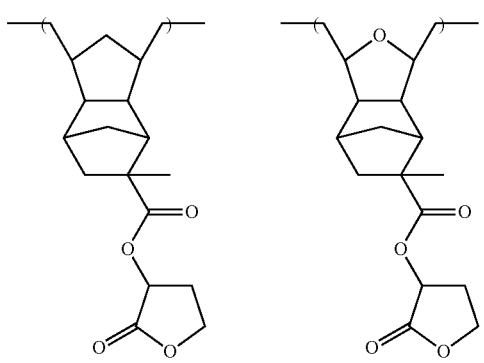
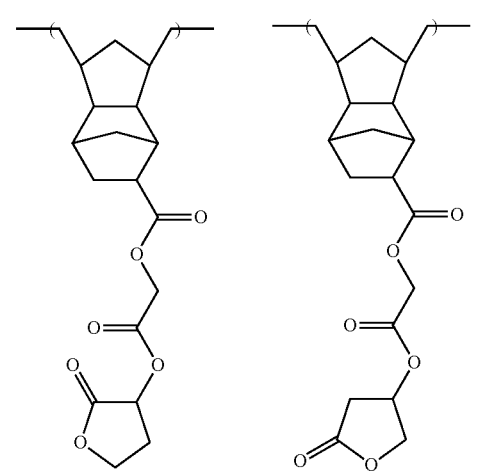
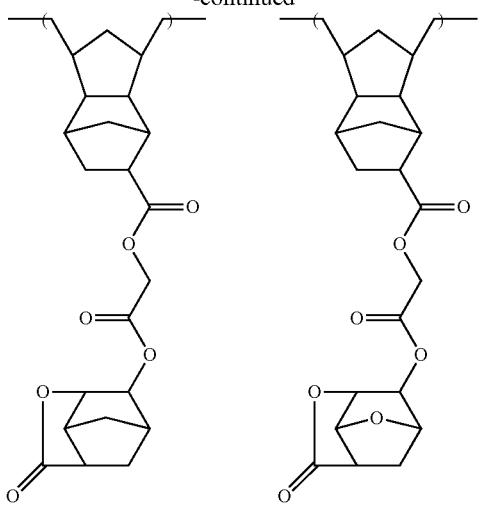
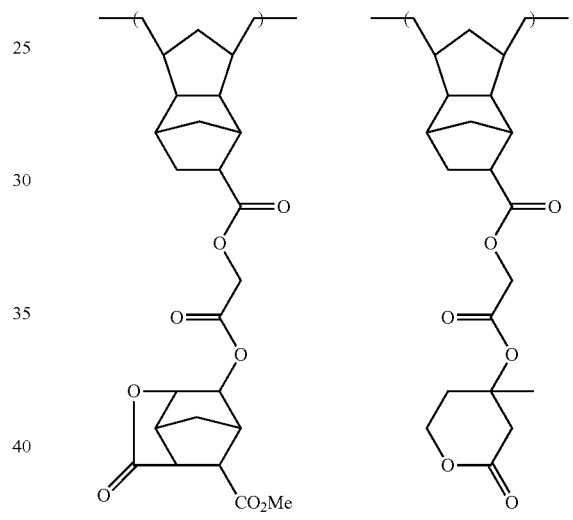
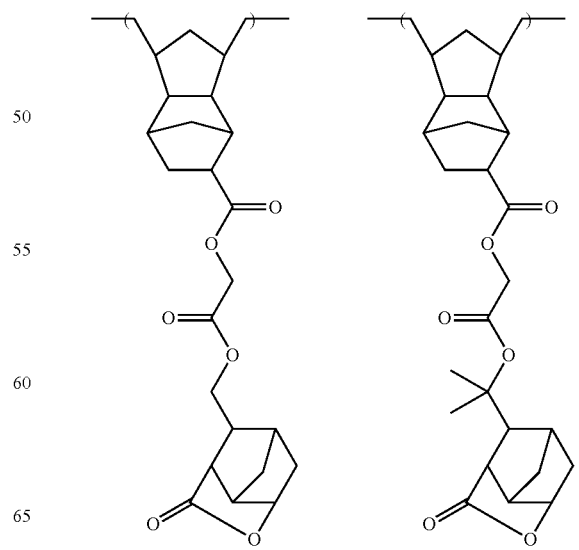

77 78
-continued -continued
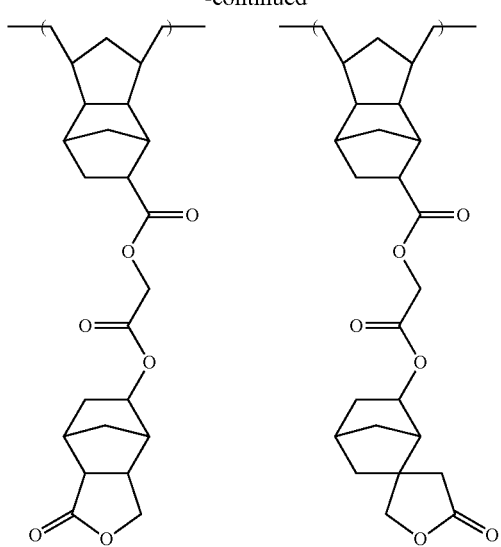
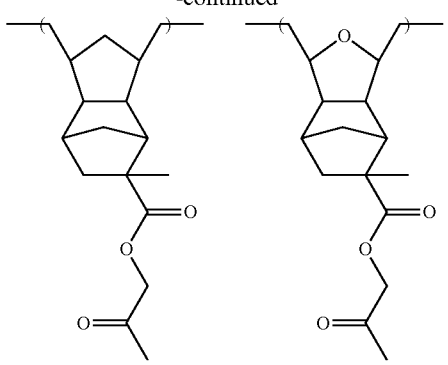
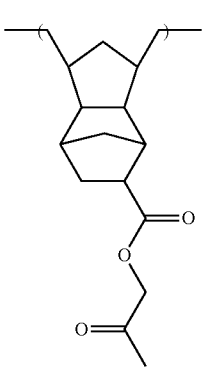
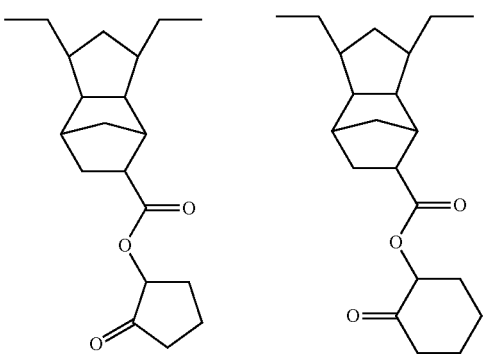
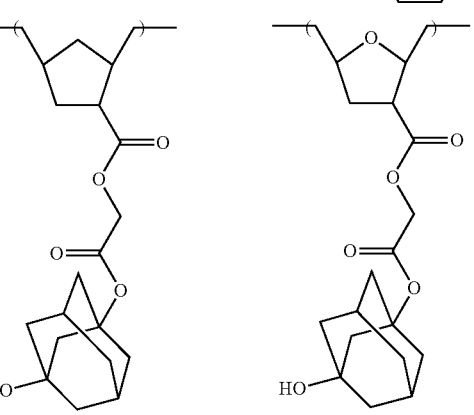

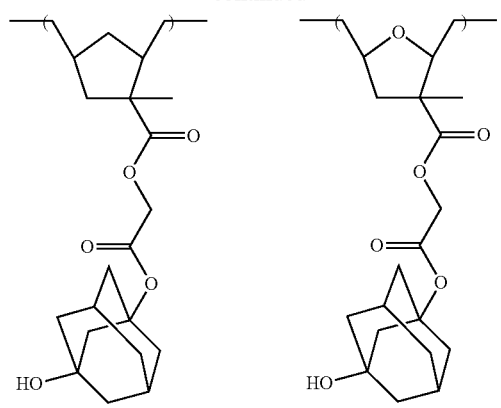
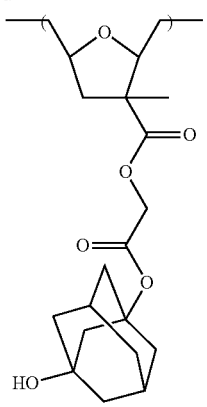
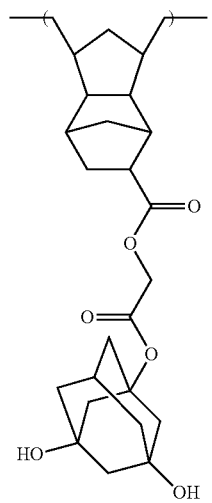
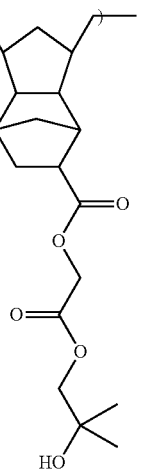
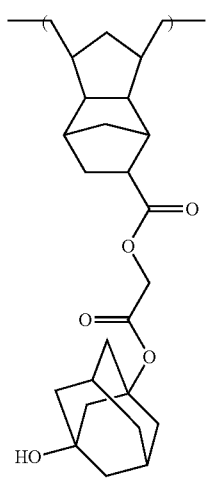
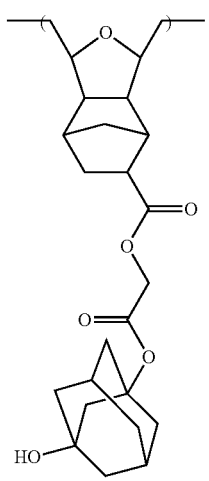
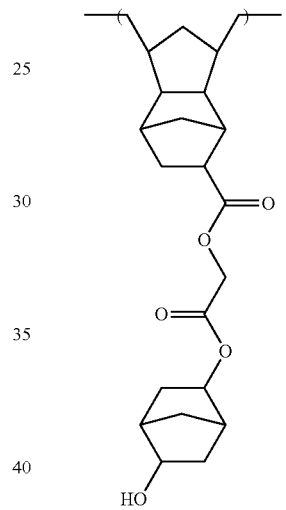
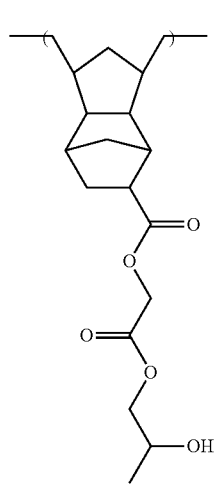
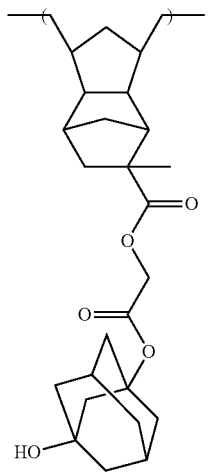
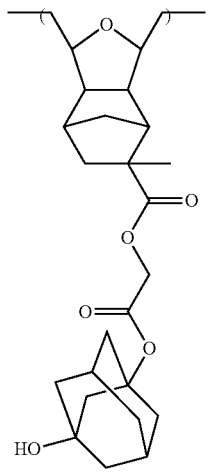
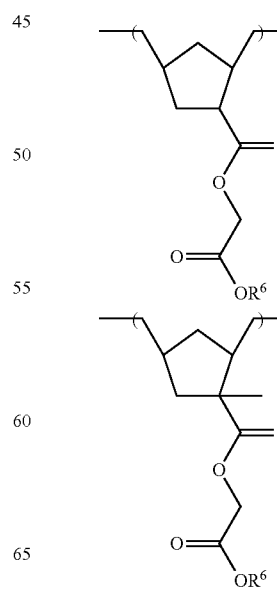
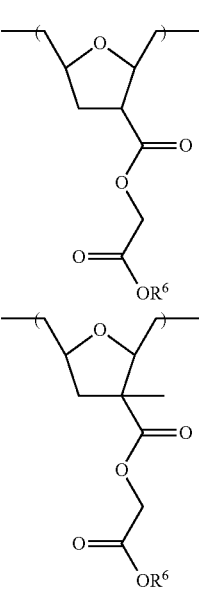

81
-continued
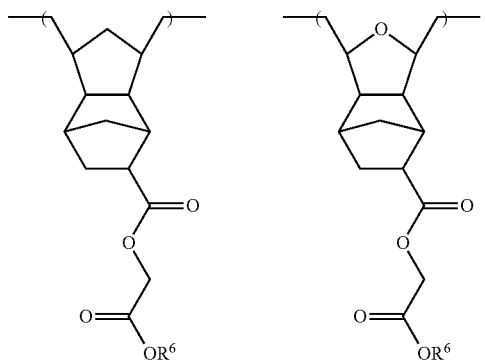
82
-continued
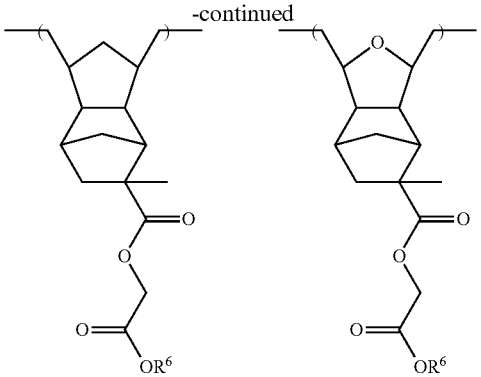
wherein $R^6$ denotes an acid labile group.
* * * * *